United States Patent [19]

Terasawa

[11] Patent Number: 5,591,991
[45] Date of Patent: Jan. 7, 1997

[54] SEMICONDUCTOR DEVICE AND METHOD OF MANUFACTURING THE SAME

[75] Inventor: Yoshio Terasawa, Katsuta, Japan

[73] Assignee: NGK Insulators, Ltd., Japan

[21] Appl. No.: 407,023

[22] PCT Filed: Jul. 28, 1994

[86] PCT No.: PCT/JP94/01241

§ 371 Date: Mar. 28, 1995

§ 102(e) Date: Mar. 28, 1995

[87] PCT Pub. No.: WO95/04375

PCT Pub. Date: Feb. 9, 1995

[30] Foreign Application Priority Data

Jul. 28, 1993 [JP] Japan .................................. 5-186450

[51] Int. Cl.$^6$ ........................... H01L 29/74; H01L 31/111
[52] U.S. Cl. ........................ 257/137; 257/142; 257/147
[58] Field of Search ................................... 257/138, 142, 257/147, 137

[56] References Cited

U.S. PATENT DOCUMENTS 4,611,235  9/1986  Bhagat ..................................... 257/138

FOREIGN PATENT DOCUMENTS

| 0425037A2 | 5/1991 | European Pat. Off. . |
| 56-38864 | 4/1981 | Japan . |
| 58-35973 | 3/1983 | Japan ..................................... 257/138 |
| 61-183917 | 8/1986 | Japan . |
| 63-224361 | 9/1988 | Japan ..................................... 257/147 |
| 1-218067 | 8/1989 | Japan . |
| 9301620 | 1/1993 | WIPO ..................................... 257/138 |

OTHER PUBLICATIONS

Patent Abstracts of Japan, vol. 11 No. 7 (E-469) Jan. 9, 1987 & JP-A-61 182259 (Toshiba Corp) Aug. 14, 1986, Abstract.

Primary Examiner—Stephen Meier
Attorney, Agent, or Firm—Parkhurst, Wendel & Burr, L.L.P.

[57] ABSTRACT

After selectively forming P$^+$-type gate regions 14 in the upper surface of a first N$^-$-type semiconductor substrate 10, gate electrodes 30 are selectively formed on the P$^+$-type gate regions. A P$^+$-type layer 12 is formed in the lower surface of the N$^-$-type substrate 10. Recessed portions 26 which can house the gate electrodes are formed in the lower surface of the second N$^-$-type semiconductor substrate 20 and an N$^+$-type layer 22 is formed in the upper surface thereof. After removing impurities from the surfaces of the first and second semiconductor substrates 10 and 20 by RCA cleaning, the surfaces are cleaned with a pure water and are dried by a spinner. Then the substrates 10 and 20 are joined to each other by heating the substrates 10 and 20 at 700–1100° C. in an H$_2$ atmosphere, while the upper surface of the first semiconductor substrate 10 is brought into contact with projected portions 29 on the lower surface of the second semiconductor substrate 20. Thus there can be obtained a static induction thyristor, static induction transistor or gate turn-off thyristor, in each of which gate regions and gate electrodes are buried within a semiconductor substrate.

13 Claims, 22 Drawing Sheets

FIG_15

FIG_16

5,591,991

SEMICONDUCTOR DEVICE AND METHOD OF MANUFACTURING THE SAME

FIELD OF THE INVENTION

The present invention relates to a semiconductor device and a method of manufacturing the same, and more particularly to a power semiconductor device such as a static induction (SI) thyristor, a static induction (SI) transistor and a gate turn-off (GTO) thyristor, wherein the turning on/off of current is controlled by means of a gate, and to a method of manufacturing such a power semiconductor device.

TECHNICAL BACKGROUND

FIGS. 1–3 are sectionally perspective views, respectively illustrating a structure and a manufacturing method of a conventional static induction thyristor.

The conventional static induction thyristors of this type have been manufactured as follows:

First, as shown in FIG. 1, a $P^+$-type gate region 314 is selectively formed in a main surface of an $N^-$-type substrate 310 by selectively diffusing P-type impurities into the main surface. Then, as shown in FIG. 2, on the $N^-$-type substrate 310 is formed an $N^-$-type epitaxial layer 320 by a chemical vapor deposition. At this time, the $P^+$-type gate region 314 is extended in this $N^-$-type epitaxial layer 320 due to an automatic doping.

Next, as illustrated in FIG. 3, in the lower surface of the $N^-$-type substrate 310 is formed a $P^+$-type layer 312 by an impurity diffusion, and in the upper surface of the $N^-$-type epitaxial layer 320 is formed an $N^+$-type layer 322 also by the impurity diffusion. Then, an anode electrode 340 is formed on the lower surface of the $P^+$-type layer 312, and a cathode electrode 350 is formed on the upper surface of the $N^+$-type layer 322.

In the thus-obtained static induction thyristor 300, the $P^+$-type layer 312 functions as an anode region, $N^+$-type layer 322 as a cathode region, both of the $N^-$-type substrate 310 and $N^-$-type epitaxial layer 320 function as an N-type base 360, and the $P^+$-type gate region 314 functions as a gate which controls an anode current flowing between the anode electrode 340 and the cathode electrode 350.

FIGS. 4–6 are sectionally perspective views, respectively illustrating a structure and a manufacturing method of a conventional GTO thyristor.

The conventional GTO thyristors of this type have been manufactured in the following manner:

First, as shown in FIG. 4, a P-type layer 416 is formed in the upper surface of an $N^-$-type substrate 410 by an impurity diffusion, and then, a $P^+$-type gate region 414 is selectively formed in a main surface of the P-type layer 416 by selectively diffusing P-type impurities into the main surface.

Next, as depicted in FIG. 5, a P-type epitaxial layer 420 is formed on the P-type layer 416 by a chemical vapor deposition. At this time, the $P^+$-type gate region 414 is expanded into this P-type epitaxial layer 420 due to an automatic doping.

Next, as shown in FIG. 6, a P-type layer 412 is formed in the lower surface of the $N^-$-type substrate 410 by an impurity diffusion, and an N-type layer 422 is formed in the upper surface of the P-type epitaxial layer 420 by the impurity diffusion. Then, an anode electrode 440 is formed on the lower surface of the P-type layer 412, and a cathode electrode 450 is formed on the upper surface of the N-type layer 422.

In the thus-obtained GTO thyristor 400, the P-type layer 412 and N-type layer 422 function as P-type emitter and N-type emitter, respectively, the $N^-$-type substrate 410 functions as an N-type base, the P-type layer 416 and the P-type epitaxial layer 420 function as P-type base 460, and the $P^+$-type gate region 414 functions as a gate which controls an anode current flowing between the anode electrode 440 and the cathode electrode 450.

FIGS. 7 and 8 are sectionally perspective views, respectively illustrating a structure and a manufacturing method of a conventional static induction thyristor with a gate metal.

The conventional static induction thyristor with a gate metal of this type have been manufactured as follows. First, as shown in FIG. 7, a groove 526 is formed in the upper surface of an $N^-$-type substrate 510 by a wet or dry etching method. Then, an $N^+$-type layer 522 and P-type layer 512 are respectively formed in the upper and lower surfaces of the $N^-$-type substrate 510 by an impurity diffusion, and further, a $P^+$-type gate region 514 is formed in the bottom surface of the groove 526.

Next, as seen in FIG. 8, there are formed a gate metal 530 on the $P^+$-type gate region 514, a cathode electrode 550 on the upper surface of the $N^+$-type layer 522, and an anode electrode 540 on the lower surface of the P-type layer 512.

In the thus-obtained static induction thyristor 500 with a gate metal, the P-type layer 512 and $N^+$-type layer 522 function as an anode region and a cathode region, respectively, the $N^-$-type substrate 510 functions as an N-type base, and the $P^+$-type gate region 514 functions as a gate which controls an anodic current flowing between the anode electrode 540 and the cathode electrode 550.

FIGS. 9 and 10 are sectionally perspective views, respectively illustrating a structure and a manufacturing method of a conventional GTO thyristor with a gate metal.

The conventional GTO thyristor with a gate electrode of this type have been manufactured as follows:

First, as explained before with reference to FIGS. 4 and 5, a P-type layer 616 is formed on an $N^-$-type substrate 610 by an epitaxial growth, which utilizes an impurity diffusion or chemical vapor deposition.

Then, as shown in FIG. 9, an N-type layer 622 and a P-type layer 612 are respectively formed in the upper surface of the P-type layer 616 and the lower surface of the $N^-$-type substrate 610 by the impurity diffusion. Next, a groove 626 is formed in the P-type layer 616 by a wet or dry etching, and a $P^+$-type gate region 614 is formed in the bottom surface of this groove 626.

Then, as illustrated in FIG. 10, a gate metal 630 is formed on the $P^+$-type gate region 614, a cathode electrode 650 on the N-type layer 622, and an anode electrode 640 is formed on the P-type layer 612.

In the thus-obtained GTO thyristor 600 with a gate electrode, the P-type layer 612 functions as a P-type emitter, the N-type layer 622 as an N-type emitter, the $N^-$-type substrate 610 as an N-type base, the P-type layer 616 as a P-type base, and the $P^+$-type gate region 614 functions as a gate which controls an anodic current flowing between the anode electrode 640 and the cathode electrode 650.

In the conventional static induction thyristor 300 shown in FIG. 3, the $P^+$-type gate region 314 doped with impurities at a high concentration is buried in the N-type base 360 for the purpose of increasing a maximum cutoff current. In order to bury the $P^+$-type gate region 314 within the N-type base 360, it is required that the $P^+$-type gate region 314 is selectively formed in a main surface of the $N^-$-type substrate 310 as shown in FIG. 1, and then the N⁻-type epitaxial layer 320 is formed on the N⁻-type substrate 310 by a chemical vapor deposition.

Since the N⁻-type epitaxial layer 320 is formed on the N⁻-type substrate 310, in which the P⁺-type gate region 314 has already been selectively formed, crystal defects such as stacking fault are liable to be produced in the N⁻-type epitaxial layer 320, especially in the portions grown on the P⁺-type gate region 314. Also, since the property of the crystals on the P⁺-type gate region 314 is different from that of the crystals on the N⁻-type substrate 310, there cannot be obtained a uniform N⁻-type epitaxial layer 320 of good quality. Consequently, there cannot be obtained a uniform N-type base 360 of good quality.

Furthermore, since this epitaxial growth is conducted at about 1100° C. under an atmospheric pressure, impurities in the P⁺-type gate region 314 are diffused into the N⁻-type substrate 310 and the N⁻-type epitaxial layer 320 during the epitaxial growth. In some cases, the conductivity type of the N⁻-type substrate 310 as well as that of the N⁻-type epitaxial layer 320 are changed from N-type to P-type in the portions lying between the P⁺-type gate regions 314, so that it is no longer possible to control the anode current by means of the P⁺-type gate regions 314.

In addition, since the impurities in the P⁺-type gate region 314 give bad influences on the crystallinity of the N⁻-type epitaxial layer 320 and the anode current, there is an upper limit for the impurity concentration in the P⁺-type gate region 314. As a result, the maximum cutoff current cannot be increased beyond a certain upper limit.

In the conventional GTO thyristor 400 shown in FIG. 6, the P⁺-type gate region 414 having impurities doped at a high concentration is buried in the P-type base 460 for the purpose of increasing a maximum cutoff current. In order to bury the P⁺-type gate region 414 within the P-type base 460, it is required that the P⁺-type gate region 414 is selectively formed in a main surface of the P-type layer 416 as shown in FIG. 4, and then the P-type epitaxial layer 420 is formed on the P-type layer 416 by a chemical vapor deposition.

Since the P-type epitaxial layer 420 is formed on the P-type layer 416, in which the P⁺-type gate region 414 has already been selectively formed, crystal defects such as stacking fault are likely to come about in the P-type epitaxial layer 420, especially in the portions grown on the P⁺-type gate region 414. Also, since the property of the crystals on the P⁺-type gate region 414 is different from that of the crystals on the P-type layer 416, there cannot be obtained a uniform P-type epitaxial layer 420 of good quality. Consequently, there cannot be obtained a uniform P-type base 460 of good quality.

Moreover, since the impurities in the P⁺-type gate region 414 affect the crystallinity of the P-type epitaxial layer 420, there is an upper limit for the impurity concentration in the P⁺-type gate region 414. As a result, the maximum cutoff current cannot be increased beyond a certain upper limit.

In the conventional static induction thyristor with a gate electrode shown in FIG. 8, the gate metal 530 is provided on the P⁺-type gate region 514, so that a gate lateral resistance is reduced, thereby increasing the maximum cutoff current. However, since it is necessary to form the groove 526, which penetrates the N⁺-type layer 522 to reach the P⁺-type gate region 514, there is a problem that N⁺-type layer 522 which functions as the cathode region is divided into small pieces, thereby increasing the resistance.

In this connection, it is preferable to use a dry etching method for forming the groove 526, because it causes less under etching. However, since the dry etching is low in etching rate, there arises another problem that it requires a quite long time to form such a deep groove as the groove 526, which reaches the P⁺-type gate region 514 through the N⁺-type layer 522.

It is also difficult to provide the gate metal 530 on the P⁺-type gate region 514, which is exposed in the bottom area of the groove 526 having such a large aspect ratio.

In the conventional GTO thyristor with a gate electrode shown in FIG. 10, the gate metal 630 is also formed on the P⁺-type gate region 614, so that a gate lateral resistance is reduced, thereby increasing the maximum cutoff current. However, since it is necessary to form the groove 626, which penetrates the N-type layer 622 to reach the P⁺-type gate region 614, there is a problem that N-type layer 622 which functions as the N-type emitter is divided into small pieces, thereby increasing the resistance.

It is preferable to use a dry etching method for forming the groove 626, because it causes less under etching. However, since the dry etching has a low etching rate, there is such a problem that it requires a long time to form such a deep groove as the groove 626, which penetrates the N-type layer 622 to reach the P⁺-type gate region 614.

In addition, it is also difficult to provide the gate metal 630 on the P⁺-type gate region 614, which is exposed in the bottom area of the groove 626 having such a large aspect ratio.

Accordingly, an object of the present invention is to mitigate the problems inherent in the conventional semiconductor devices and to provide a semiconductor device having a large maximum cutoff current, a low gate resistance and stable properties.

It is another object of the present invention to provide a method of manufacturing such a semiconductor device reliably with high throughput.

DISCLOSURE OF THE INVENTION

According to the invention, a method of manufacturing a semiconductor device comprises the steps of:

preparing a first and a second semiconductor substrates of one conductivity type, each having a first and a second main surfaces;

selectively forming a plurality of gate regions respectively composed of a semiconductor material in the first main surface of the first semiconductor substrate by partially doping impurities into the first main surface of the first semiconductor substrate in such a manner that portions of the first main surface of the first semiconductor substrate are exposed between the gate regions;

providing gate electrodes on respective gate regions, said gate electrodes being made of an electrically good-conductive body;

providing the first main surface of the second semiconductor substrate with such portions that can be in contact with the portions of the first main surface of the first semiconductor substrate, which are exposed between the gate regions; and bringing the portions of the first main surface of the first semiconductor substrate into contact with the portions of the first main surface of the second semiconductor substrate.

In such a manufacturing method according to the present invention, a plurality of gate regions composed of a semiconductor material doped with impurities are selectively formed in the first main surface of the first semiconductor substrate of one conductivity type so that portions of the first main surface of the first semiconductor substrate are exposed between the gate regions, while providing the first main surface of the second semiconductor substrate with a plurality of such portions that can be in contact with the portions of the first main surface of the first semiconductor substrate, which are exposed between the gate regions; and then, the portions of the first main surface of the first semiconductor substrate exposed between the gate regions and the portions of the first main surface of the second semiconductor substrate are brought into contact with each other.

As described above, according to the present invention, a base region composed of the semiconductor substrate body including gate regions embedded therein is formed by joining the first and second semiconductor substrates together without conducting an epitaxial growth. Accordingly, the base region having a good crystallinity can be obtained, and the conductivity type of the base regions is hardly changed into the opposite conductivity type of the portions lying between the gate regions. Therefore, the anode current can be always controlled by means of the gate regions. In addition, it is possible to conduct a high concentration doping for the gate regions. Since a gate electrode made of an electrically good-conductive body such as a metal is formed on the gate region, a gate lateral resistance can be reduced, thereby increasing a maximum cutoff current. Moreover, the epitaxial growth has to be conducted at a high temperature not lower than 1100° C., so that it is highly likely to happen an undesired diffusion of doped impurities. To the contrary, in the case where two semiconductor substrates are joined together, there scarcely happens a diffusion of doped impurities.

In a preferred embodiment of the method of manufacturing a semiconductor device according to the present invention, the first main surface of the second semiconductor substrate is provided with the portions which can be in contact with the portions of the first main surface of the first semiconductor substrate exposed between the gate regions, by forming a plurality of recessed portions in the first main surface of the second semiconductor substrate, each of which being able to house one of the plural gate electrodes.

In another preferred embodiment of the method of manufacturing semiconductor devices according to the present invention, the step of forming the plurality of gate regions in the first main surface of the first semiconductor substrate comprises the sub-steps of forming a plurality of first recessed portions in the first main surface of the first semiconductor substrate and forming the gate region in at least bottom surface of each one of the first recessed portions by doping impurities into the bottom surface; the gate electrodes made of an electrically good-conductive body are respectively formed on the gate regions so that the tops of respective gate electrodes protrude beyond the level of the first main surface of the first semiconductor substrate; the first main surface of the second semiconductor substrate are provided with a plurality of second recessed portions, each of which is able to house one of the plural gate electrodes; and the first and second semiconductor substrates are brought into contact with each other so that the gate electrodes are respectively housed in the second recessed portions formed in the first main surface of the second semiconductor substrate.

In a still another preferred embodiment of the method of manufacturing a semiconductor device according to the present invention, the step of forming the plurality of gate regions in the first main surface of the first semiconductor substrate comprises the sub-steps of forming a plurality of recessed portions in the first main surface of the first semiconductor substrate and forming the gate regions in at least bottom surfaces of respective recessed portions by doping impurities into the bottom surface; whereby the gate electrodes are respectively formed on respective gate regions so that the gate electrodes are completely contained within respective recessed portions.

In these embodiments, recessed portions are formed in both of the first main surface of the first semiconductor substrate and the first main surface of the second semiconductor substrate or in the first main surface of the second semiconductor substrate so as to house the gate electrodes, and thus it is not necessary to form deep grooves starting from the second main surface of the second semiconductor substrate. Accordingly, it is no more necessary to divide the cathode region into small pieces, so that an increase in the resistance can be avoided. Also, since it is enough for a recessed portion formed in the first main surface of the second semiconductor substrate to have a space for housing a gate electrode, the recessed portion does not need to be made as a deep recess. Accordingly, it does not take much time to form such a recessed portion even by a dry etching method having a low etching rate. Furthermore, since the gate electrodes are housed in the first recessed portions formed in the first main surface of the second semiconductor substrate, it is not necessary to form gate electrodes within grooves having a large aspect ratio.

Especially in an embodiment where recessed portions are formed in both the first main surfaces of the first and second semiconductor substrates, the gate electrodes are housed by the first and second recessed portions. Therefore, when compared with the case where the gate electrodes are housed by only the recessed portions formed in the first main surface of the first semiconductor substrate, the aspect ratio of the respective recessed portions can be smaller, and therefore the recessed portions can be formed much more easily.

Further, in an embodiment where the gate electrodes are housed in the recessed portions formed in the first main surface of the first semiconductor substrate, it is no longer necessary to form recessed portions in the first main surface of the second semiconductor substrate to be brought into contact or joined with the first main surface of the first semiconductor substrate exposed between the gate regions. Namely, the first main surface of the second semiconductor substrate may be formed as a flat surface. As a result, any special positioning is not required at a time when the first main surface of the first semiconductor substrate is brought into contact or joined with the first main surface of the second semiconductor substrate.

In the preferred embodiments of the manufacturing method according to the present invention, after bringing the first and second semiconductor substrates into contact with each other, these semiconductor substrates are subjected to heating in order to positively join the portions of the first main surface of the first semiconductor substrate exposed between the gate regions with the portions of the first main surface of the second semiconductor substrate.

As explained before, a temperature not lower than 1100° C. is necessary for the epitaxial growth, and thus it is highly likely to happen a diffusion of doped impurities. To the contrary, the two semiconductor substrates can be joined together when heated at a temperature around 200°–300° C. or higher, and therefore, there scarcely happens a diffusion of doped impurities. Incidentally, although this joining can be conducted without applying a pressure, it can be conducted at a lower temperature when a pressure is applied.

In a still another preferred embodiment of the method of manufacturing a semiconductor device according to the present invention, contact regions composed of high-concentration semiconductor regions of one conductivity type having an impurity concentration higher than that of these semiconductor substrates are formed in at least either of the portions of the first main surface of the first semiconductor substrate exposed between the gate regions and the portions of the first main surface of the second semiconductor substrate, before joining the first and second semiconductor substrates with each other.

The first main surfaces of the first and second semiconductor substrates provided with these high-concentration contact regions are decreased in contact resistance, and thus realize an electrically good connection. With respect to the depth of these contact regions having high impurity concentration, it is only required to ensure an electrically good connection in joined surfaces; and very thin contact regions are preferable. Namely, they are preferably within the range of 10–100,000 Å, more preferably within the range of 10–10,000 Å. When the contact regions are too deep, the carriers are excessively scattered by the impurities, thereby making it difficult to flow an anode current. Further, in a case where this invention is applied to a static induction thyristor, a depletion layer hardly spreads out from the gate regions, so that the control of the anode current becomes difficult.

As is clear from the embodiments described later, the method of manufacturing a semiconductor device according to the present invention is particularly preferably applied to a production of static induction thyristors and a production of GTO thyristors. However, the method of manufacturing a semiconductor device according to the present invention is not restricted to the production of static induction thyristors and GTO thyristors, and is applicable to a production of static induction transistors as well as to a production of other transistors.

A semiconductor device according to the present invention comprises a semiconductor substrate, an anode electrode provided on one surface of the semiconductor substrate, a cathode electrode provided on the opposite surface of the semiconductor substrate and a gate formed within the semiconductor substrate for controlling a current flowing between the anode electrode and the cathode electrode, wherein said gate comprises a gate region which is made of a semiconductor body having impurities doped therein and a gate electrode which is formed on the gate region and made of an electrically good-conductive body.

In a preferred embodiment of the semiconductor device according to the present invention, the semiconductor substrate is constituted by joining a first semiconductor substrate of one conductivity type and a second semiconductor substrate of one conductivity type together, and at least one of joined surfaces of the first and second semiconductor substrates is provided with a recessed portion to house the gate electrode.

In another preferred embodiment of the semiconductor device according to the present invention, a contact region of one conductivity type having an impurity concentration higher than that of the semiconductor substrates is formed in at least one of joined surfaces of the first and second semiconductor substrates.

In these semiconductor devices according to the present invention, the gate includes the gate region of an impurity-doped semiconductor and the gate electrode of a metal formed on the gate region. Accordingly, the gate lateral resistance is decreased, thereby increasing the maximum cutoff current. Since not only the gate region of an impurity-doped semiconductor but also the gate electrode of a metal formed thereon are buried within the semiconductor substrate, the cathode region is not divided into small pieces, thereby avoiding to have a high resistance.

The present invention may be applied to a static induction thyristor by constituting a semiconductor device such that the semiconductor substrate includes a first semiconductor layer of one conductivity type, a second semiconductor layer of the opposite conductivity type formed on the first semiconductor layer, and a third semiconductor layer of the opposite conductivity type formed on the second semiconductor layer and having an impurity concentration higher than that of the second semiconductor layer; either one of the anode electrode and cathode electrode is electrically connected to the first semiconductor layer; the other one of the anode electrode and cathode electrode is electrically connected to the third semiconductor layer; a semiconductor body constituting the gate region is the semiconductor body of the one conductivity type; and the gate region as well as the gate electrode are embedded within the second semiconductor layer.

In this case, a junction between the gate region and the second semiconductor layer may be covered with an insulating layer. With this constitution, passivation effects are attained for the PN junction between the gate region and the second semiconductor layer, thereby improving the pressure resistance between the gate and the cathode.

The present invention may be applied to a GTO thyristor by constituting a semiconductor device such that the semiconductor substrate includes a first semiconductor layer of one conductivity type, a second semiconductor layer of the opposite conductivity type formed on the first semiconductor layer, a third semiconductor layer of the one conductivity type formed on the second semiconductor layer, and a fourth semiconductor layer of the opposite conductivity type formed on the third semiconductor layer; either one of the anode electrode and cathode electrode is electrically connected to the first semiconductor layer; the other one of the anode electrode and cathode electrode is electrically connected to the fourth semiconductor layer; the gate region is a semiconductor body of the one conductivity type having an impurity concentration higher than that of the third semiconductor layer; and the gate region and the gate electrode are embedded within the third semiconductor layer.

In this case, the gate electrode may be formed to cover the junction between the gate region and the third semiconductor layer. With this constitution, the gate resistance can be more effectively reduced, thereby increasing the operating frequency.

Further, when the gate electrode is composed of a high melting point metal, the joining of the semiconductor substrates are conducted at a higher temperature so that joined surfaces of good quality can be obtained.

Incidentally, when the flatness and cleanness of the surfaces are high enough, the joining of the semiconductor substrates can be conducted at room temperature.

BEST MODE OF THE INVENTION

Now, embodiments of the present invention will be explained by referring to the attached drawings.

Figure 1:
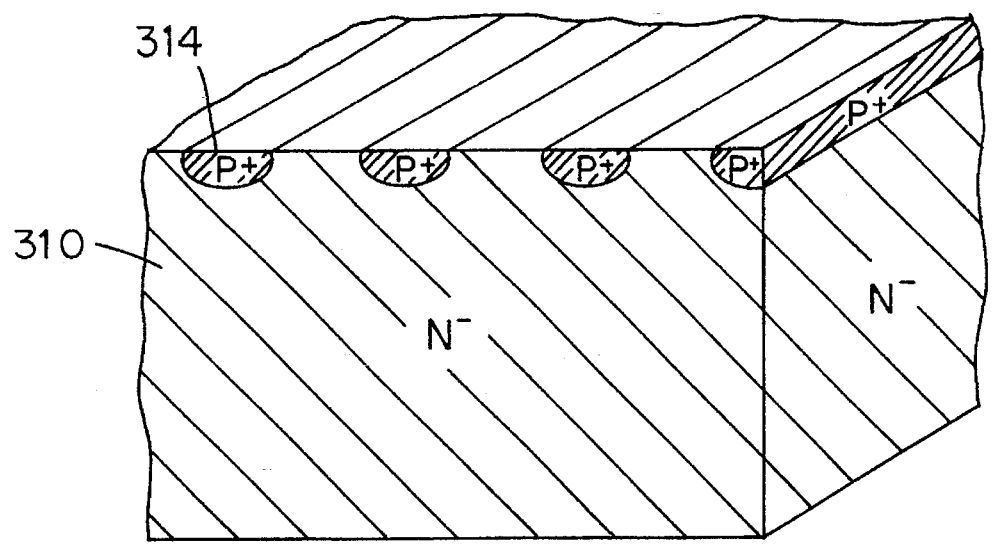
FIG. 1 is a sectionally perspective view illustrating a conventional method of manufacturing a static induction thyristor.
Figure 2:
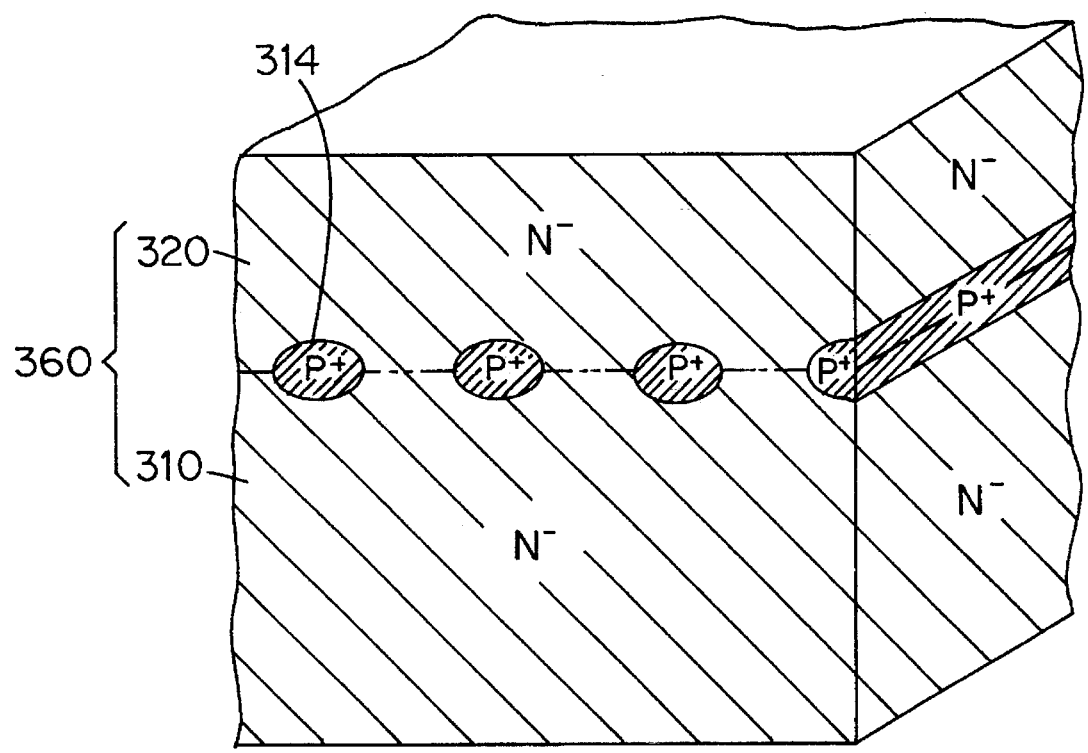
FIG. 2 is a sectionally perspective view showing a conventional method of manufacturing a static induction thyristor.
Figure 3:
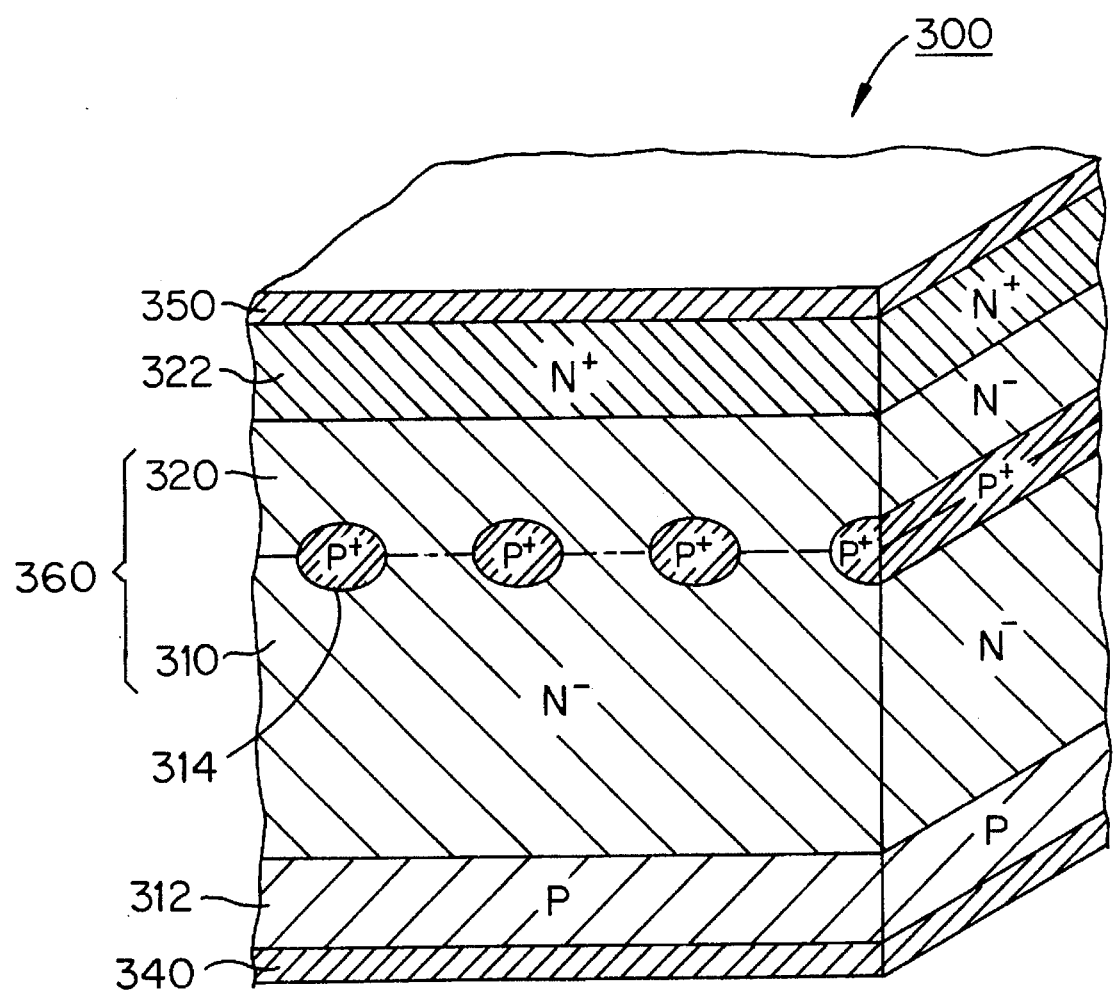
FIG. 3 is a sectionally perspective view depicting a conventional method of manufacturing a static induction thyristor.
Figure 4:
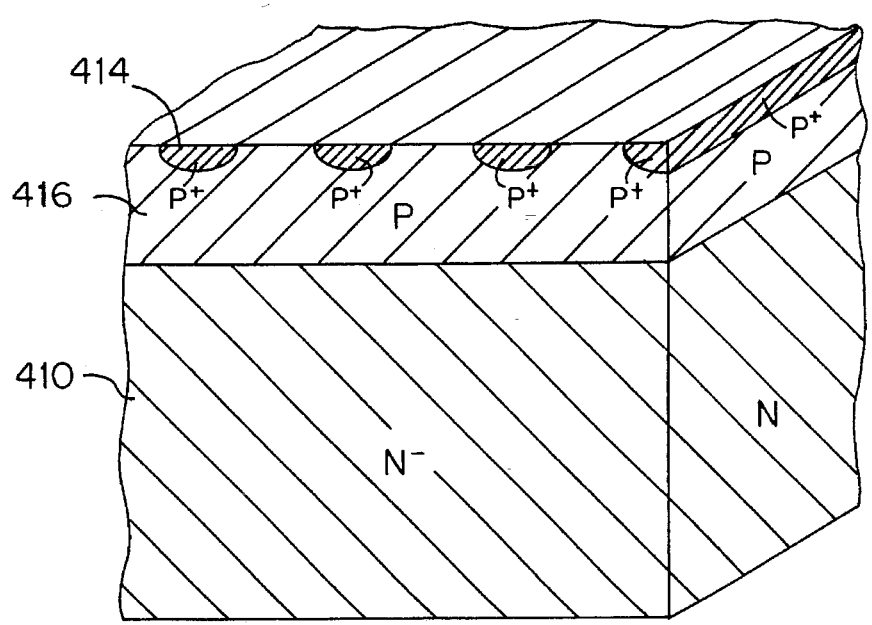
FIG. 4 is a sectionally perspective view showing a conventional method of manufacturing a GTO thyristor.
Figure 5:
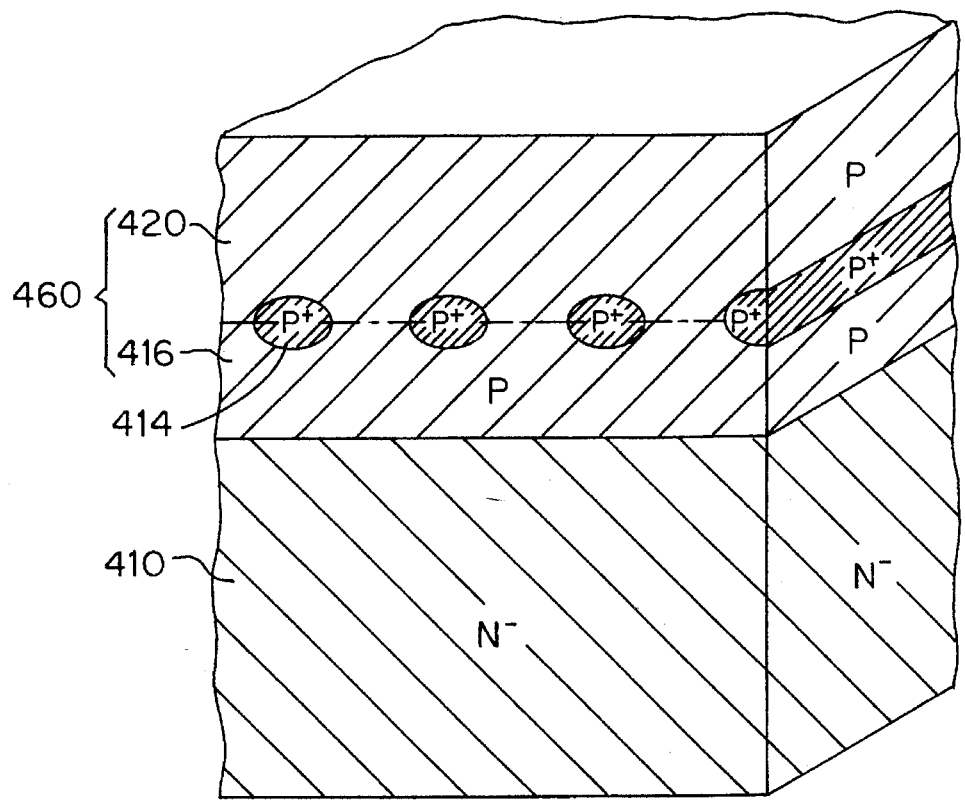
FIG. 5 is a sectionally perspective view illustrating a conventional method of manufacturing a GTO thyristor.
Figure 6:
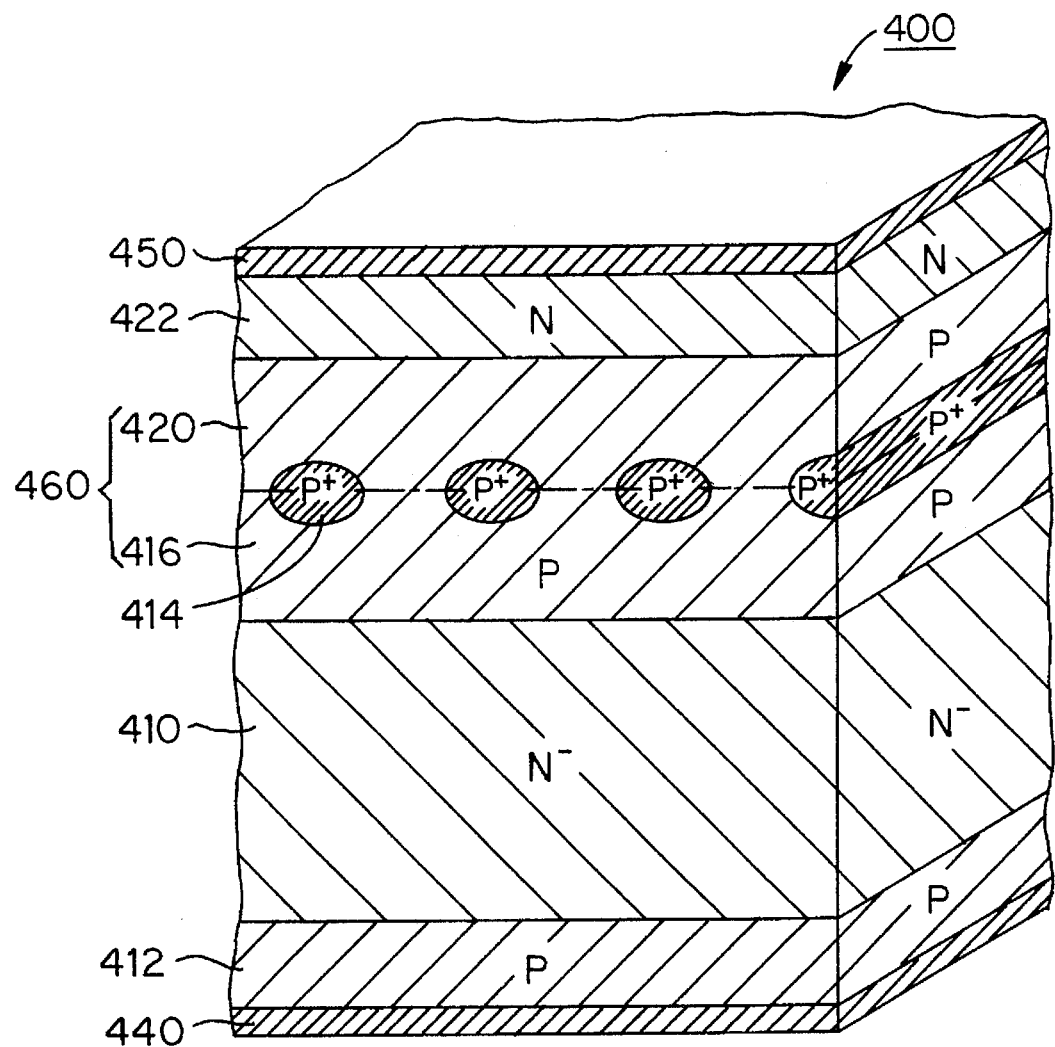
FIG. 6 is a sectionally perspective view representing a conventional method of manufacturing a GTO thyristor.
Figure 7:
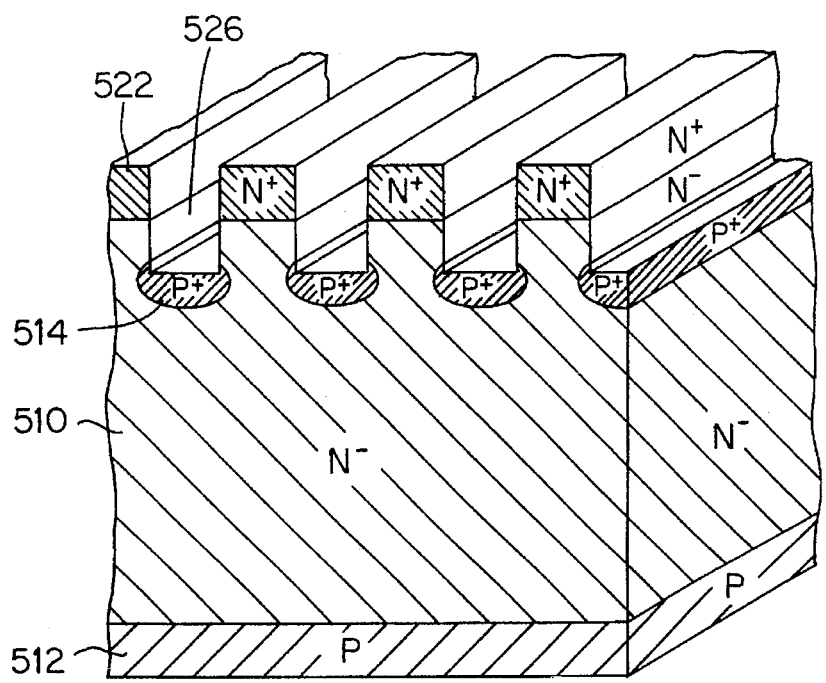
FIG. 7 is a sectionally perspective view depicting a conventional method of manufacturing a static induction thyristor.
Figure 8:
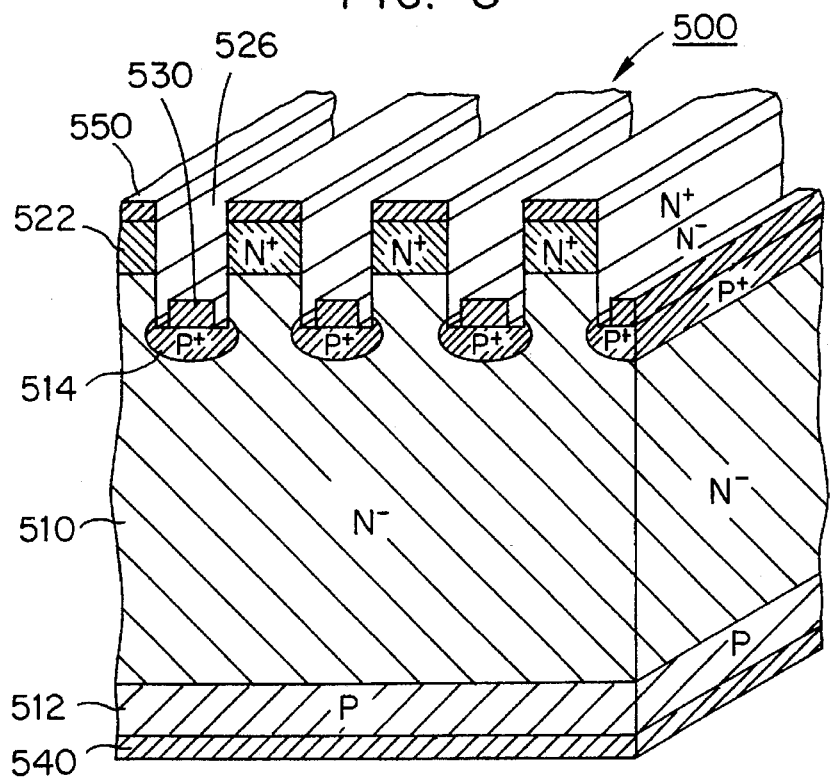
FIG. 8 is a sectionally perspective view illustrating a conventional method of manufacturing a static induction thyristor.
Figure 9:
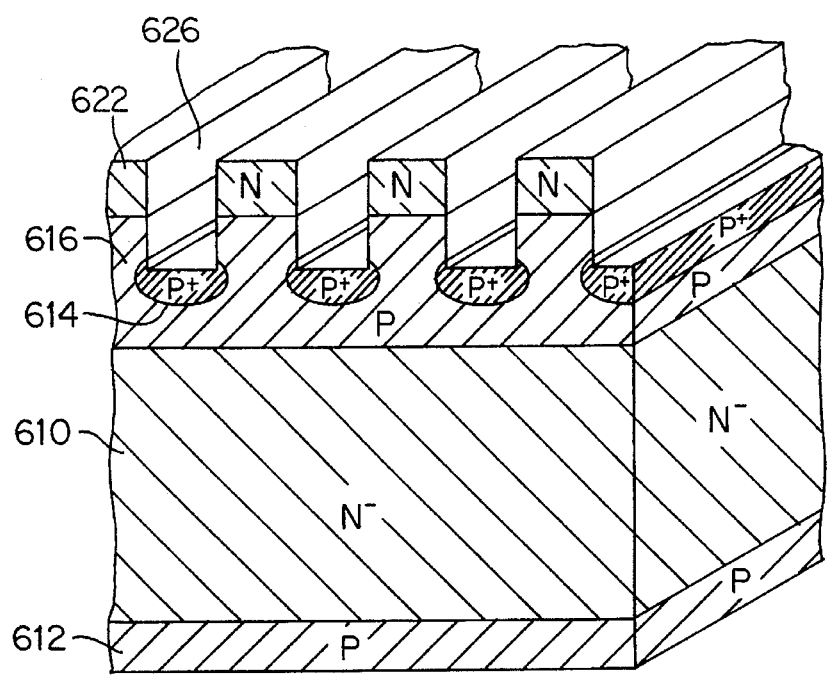
FIG. 9 is a sectionally perspective view showing a conventional method of manufacturing a GTO thyristor.
Figure 10:
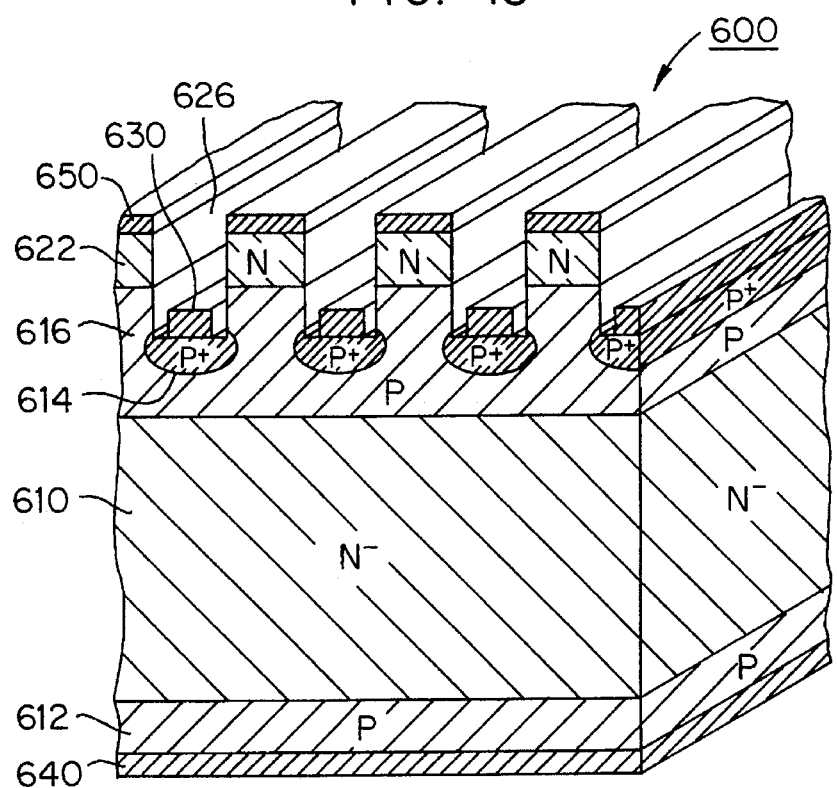
FIG. 10 is a sectionally perspective view illustrating a conventional method of manufacturing a GTO thyristor.
Figure 11:
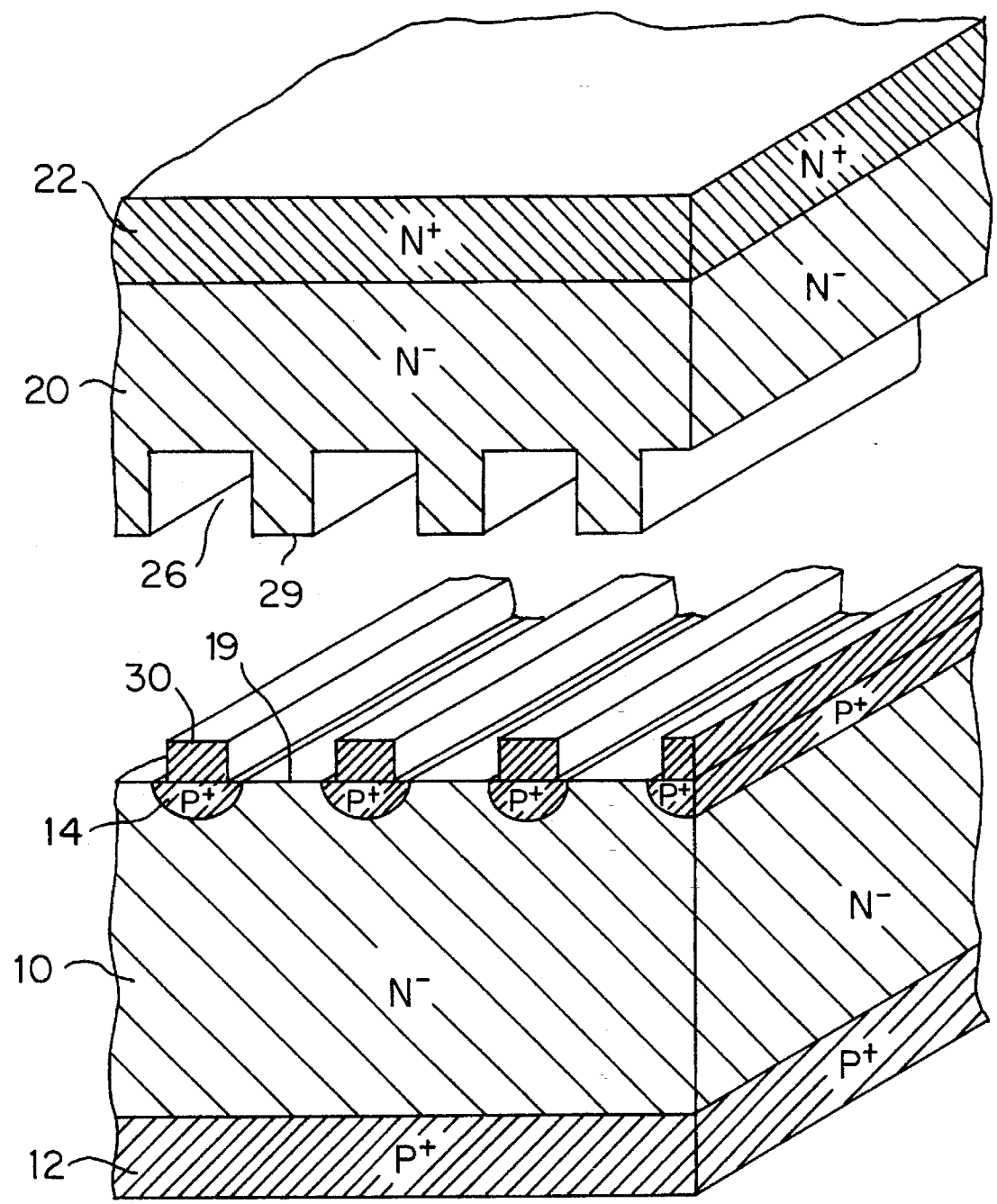
FIG. 11 is a sectionally perspective view representing a method of manufacturing a static induction thyristor as a first embodiment according to the present invention.
Figure 12:
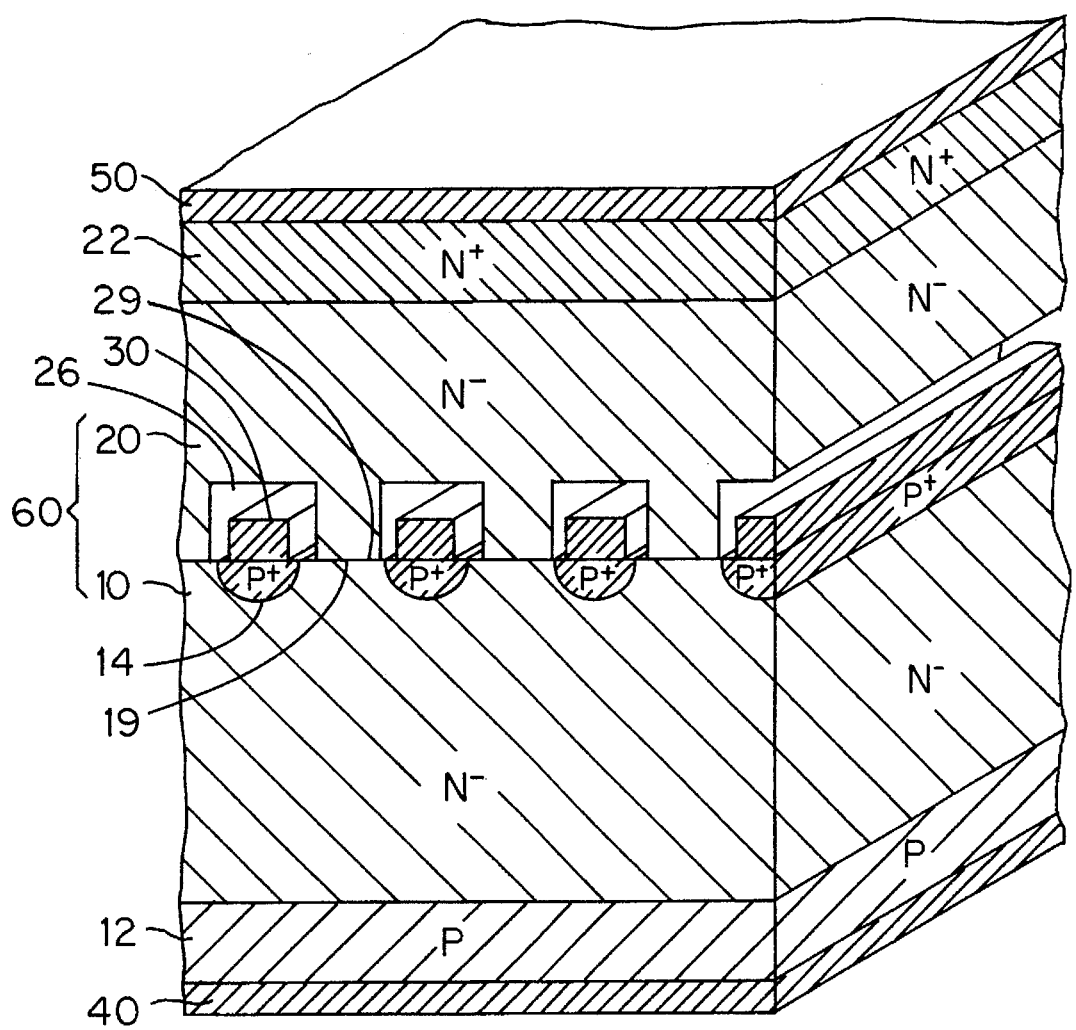
FIG. 12 is a sectionally perspective view showing a structure and manufacturing processes for the static induction thyristor of the first embodiment of the present invention.

FIGS. 11 and 12 are sectionally perspective views illustrating a static induction thyristor of a first embodiment of the present invention and a method of manufacturing this thyristor.

First of all, there are prepared a first $N^-$-type substrate 10 and a second $N^-$-type substrate 20, respectively having been subjected to a mirror-polishing at least in a surface to be joined with each other.

Then, as shown in FIG. 11, a $P^+$-type layer 12 is formed in a lower surface of the first $N^-$-type substrate 10 by an impurity diffusion. Next, by selectively diffusing P-type impurities into the upper surface of the first $N^-$-type substrate 10, a plurality of $P^+$-type gate regions 14 are formed therein in such a manner that portions of the upper surface 19 of the first $N^-$-type substrate 10 are exposed between the gate regions 14. The gate regions 14 are respectively shaped into a narrow strip, and arranged in parallel with each other at an interval of 30 µm. Then, a gate electrode 30 made of a tungsten as a high melting point metal is selectively formed on each $P^+$-type gate region 14 by a photolithography technique.

Meanwhile, a plurality of recessed portions 26, which can respectively house each of the plural gate electrodes 30, are formed in parallel with each other in the lower surface of the second $N^-$-type substrate 20 through the photolithography technique. Portions not provided with the recessed portions 26 constitute projected portions 29 to be joined with the upper surface 19 of the first $N^-$-type substrate 10 exposed between the $P^+$-type gate regions 14. An $N^+$-type layer 22 is formed in advance on the upper surface of the second $N^-$-type substrate 20 by an impurity diffusion.

After removing organic substances and metallic substances from the surfaces of the first and second $N^-$-type substrates 10 and 20 by ultrasonic cleaning with use of sulfuric acid and aqueous solution of hydrogen peroxide, these $N^-$-type substrates 10 and 20 are cleaned with a pure water and dried by a spinner at a room temperature.

Then, as shown in FIG. 12, while keeping the upper surface 19 of the first $N^-$-type substrate 10 exposed between the $P^+$-type gate regions 14 and the projected portions 29 of the second $N^-$-type substrate 20 to be brought into contact with each other, the $N^-$-type substrate 10 and the $N^-$-type substrate 20 are heated at 800° C. in a hydrogen atmosphere to join the substrates together. In this connection, when the gate electrode 30 is made of an aluminum, the joining process is conducted at 400° C.

Next, an anode electrode 40 and a cathode electrode 50 are formed on the lower surface of the $P^+$-type layer 12 and the upper surface of the $N^+$-type layer 22, respectively.

In the thus-produced static induction thyristor 100, the $P^+$-type layer 12 functions as an anode region, the $N^+$-type layer 22 as a cathode region, the $N^-$-type substrate 10 and the $N^-$-type substrate 20 as an N-type base 60, and the $P^+$-type gate region 14 and the gate electrode 30 function as a gate, which controls an anode current flowing between the anode electrode 40 and the cathode electrode 50.

Since the N-type base 60, in which the P$^+$-type gate region 14 is embedded, is formed by joining the N$^-$-type substrate 10 and the N$^-$-type substrate 20 together, the obtained N-type base 60 has a uniform crystal structure of good quality. In addition, it does not involve such a problem that the conductivity type of the N-type base 60 is changed to P-type in the portions lying between the P$^+$-type gate regions 14. Accordingly, it can be avoided to lose the control of the anode current.

In addition, since the gate electrode 30 of tungsten is formed on the P$^+$-type gate region 14, the gate lateral resistance is reduced, thereby increasing the maximum cut-off current. Also, since the gate electrode 30 is housed in the recessed portion 26 of the second N$^-$-type substrate 20, it is not necessary to divide the N$^+$-type layer 22 and the N$^-$-type substrate 20 into small pieces for the purpose of forming the gate electrode 30, which leads to a high resistance. Moreover, it is not necessary to form the gate electrode 30 within a groove having a large aspect ratio.

Since the recessed portion 26 formed in the lower surface of the second N$^-$-type substrate 20 is only required to have a space enough to house the gate electrode 30, the formation thereof does not take much time.

In this embodiment, a joining process can be conducted at a high temperature because the gate electrode 30 is made of tungsten, and thus there are obtained joined surfaces having a good quality.

Incidentally, the joining process is conducted at 800° C. in this embodiment. It is not preferable to conduct the joining process at 1100° C. or higher, because impurities in the P$^+$-type gate regions 14 diffuse into the N$^-$-type substrates 10 and 20, exerting a bad influence on the properties of the thyristor. The joining process is more preferably performed at a temperature within a range of 400°–1100° C. under the atmospheric pressure. This is due to the fact that thermal impurity diffusion is hardly carried out and a deformation of the crystal lattice can be suppressed at such a temperature.

Although the first and second N$^-$-type substrates 10 and 20 are joined together without being applied with a pressure in this embodiment, it is preferable to conduct the joining process while applying a pressure from the outer sides of the N$^-$-type substrates 10 and 20. By applying a pressure thereto, the joining temperature can be set at a lower one, the thermal diffusion can be suppressed, and there can be decreased such portions that are not in a contacted state. It is preferable to apply a pressure within a range of 0.1–100 kg/cm$^2$. When it is not more than 0.1 kg/cm$^2$, the contact between the substrates is insufficient. On the other hand, when it is not less than 100 kg/cm$^2$, a displacement might be caused by a deformation. When applying a pressure, the joining is conducted preferably at a temperature of 400°–1100° C., more preferably at a temperature of 500°–1000° C., because the applied pressure allows a joining at a lower temperature.

Figure 13:
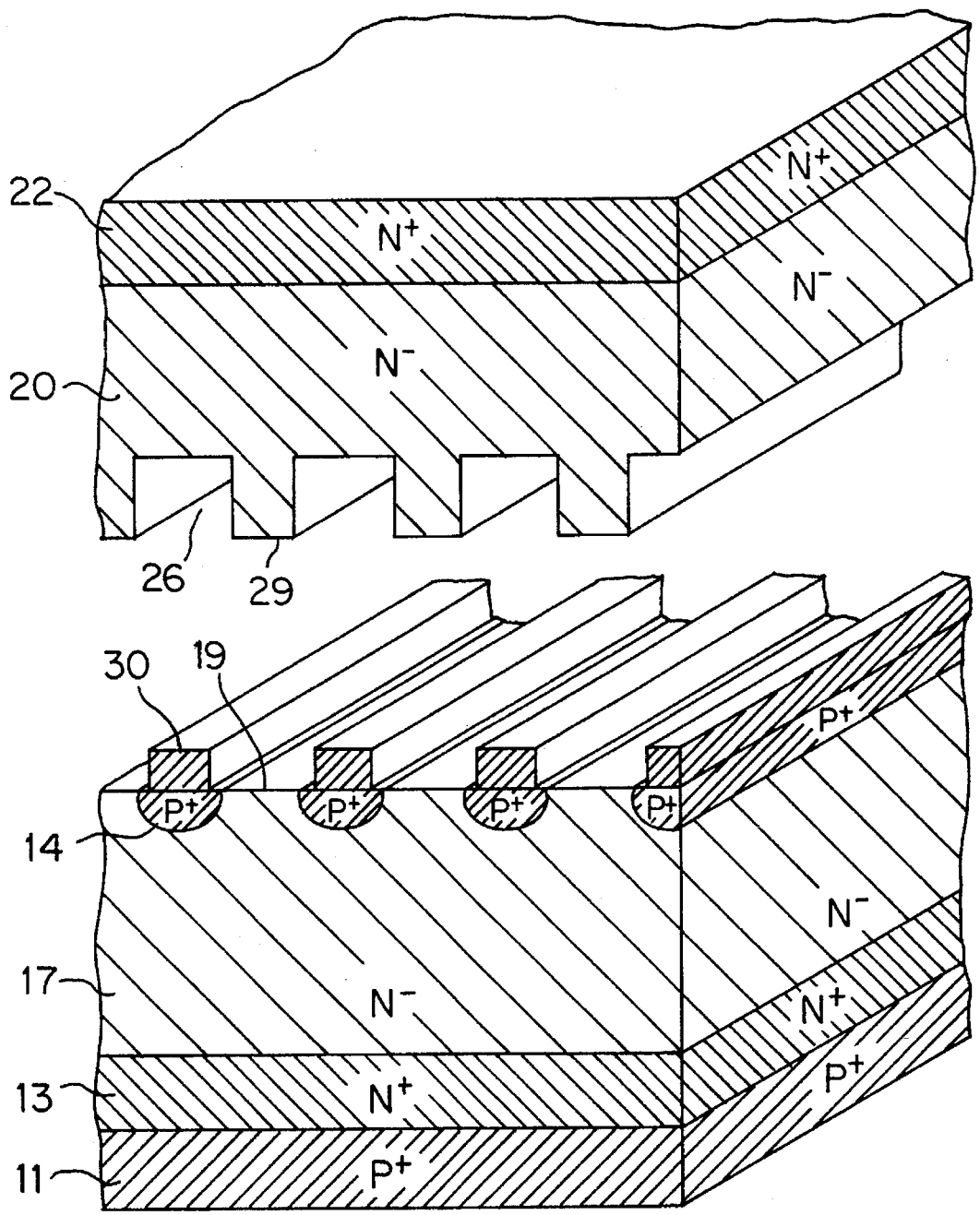
FIG. 13 is a sectionally perspective view illustrating a structure and a manufacturing method of a static induction thyristor as a modification of the first embodiment of the present invention.

In the present embodiment, the P$^+$-type layer 12 is formed in the lower surface of the first N$^-$-type substrate 10 and then the P$^+$-type gate region 14 is formed in the upper surface of the substrate. However, as shown in FIG. 13, it can also be constituted by successively forming an N$^+$-type layer 13 and an N$^-$-type layer 17 in a surface of a P-type substrate 11 having a thickness of 300–500 μm to form a PNN$^-$-structure, and then providing the upper surface of the N$^-$-type layer 17 with a P$^+$-type gate region 14.

Figure 14:
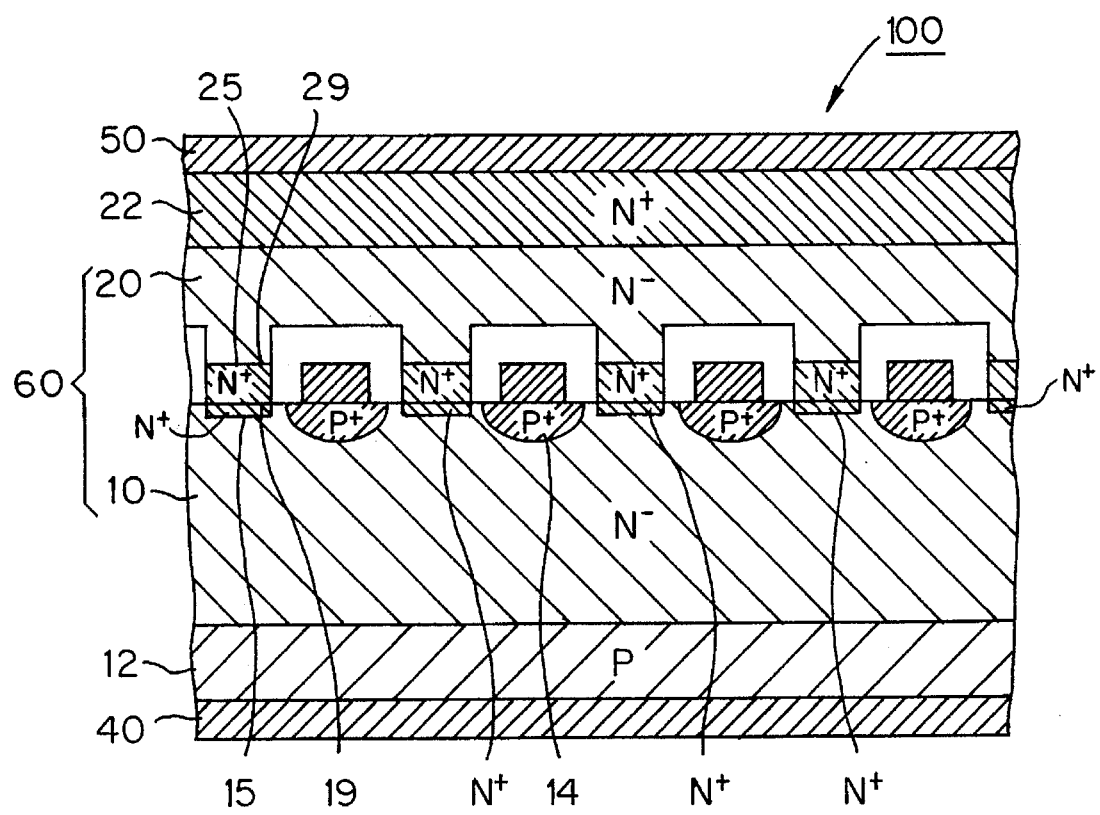
FIG. 14 is a sectional view depicting a structure and a manufacturing method of a static induction thyristor as a second embodiment of the present invention.

FIG. 14 is a sectional view illustrating a structure and a manufacturing method of a static induction thyristor as a second embodiment of the semiconductor device according to the present invention.

The structure and manufacturing method of this embodiment is the same as those of the first embodiment except that an N$^+$-type contact region 15 and N$^+$-type region 25 are formed respectively in the upper surface 19 of the first N$^-$-type substrate 10 exposed between the plural strip-shaped, P$^+$-type gate regions 14 arranged in parallel with each other and in the lower surface of the plural projected portions 29 formed in the lower surface of the second N$^-$-type substrate 20.

These N$^+$-type regions 15 and 25 are formed before joining the N$^-$-type substrates 10 and 20 together. By forming these N$^+$-type regions 15 and 25, there can be improved an electric connection between the upper surface 19 of the N$^-$-type substrate 10 exposed between the P$^+$-type gate regions 14 and the lower surface of the projected portions 29 formed in the lower surface of the N$^-$-type substrate 20, thereby reducing a contact resistance. Thicknesses of the N$^+$-type regions 15 and 25 are set at 10 Å and 30 Å, respectively. Although the N$^+$-type regions 15 and 25 are formed in both of the first and second N$^-$-type substrates 10 and 20 in the present embodiment, it is sufficient to form an N$^+$-type region in a surface of either one of the substrates.

Figure 15:
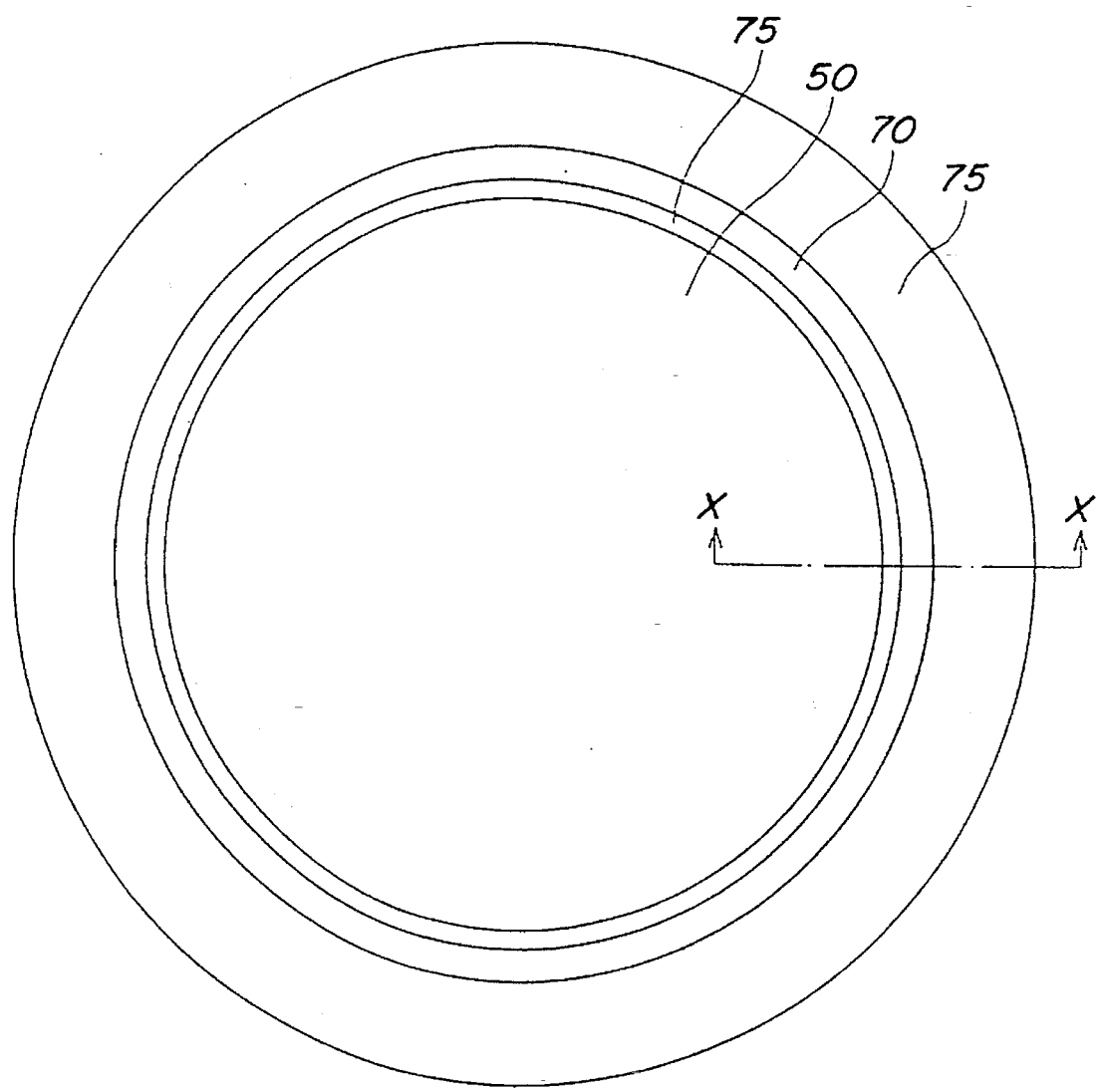
FIG. 15 is a plan view illustrating a method of manufacturing a static induction thyristor as a third embodiment of the present invention.
Figure 16:
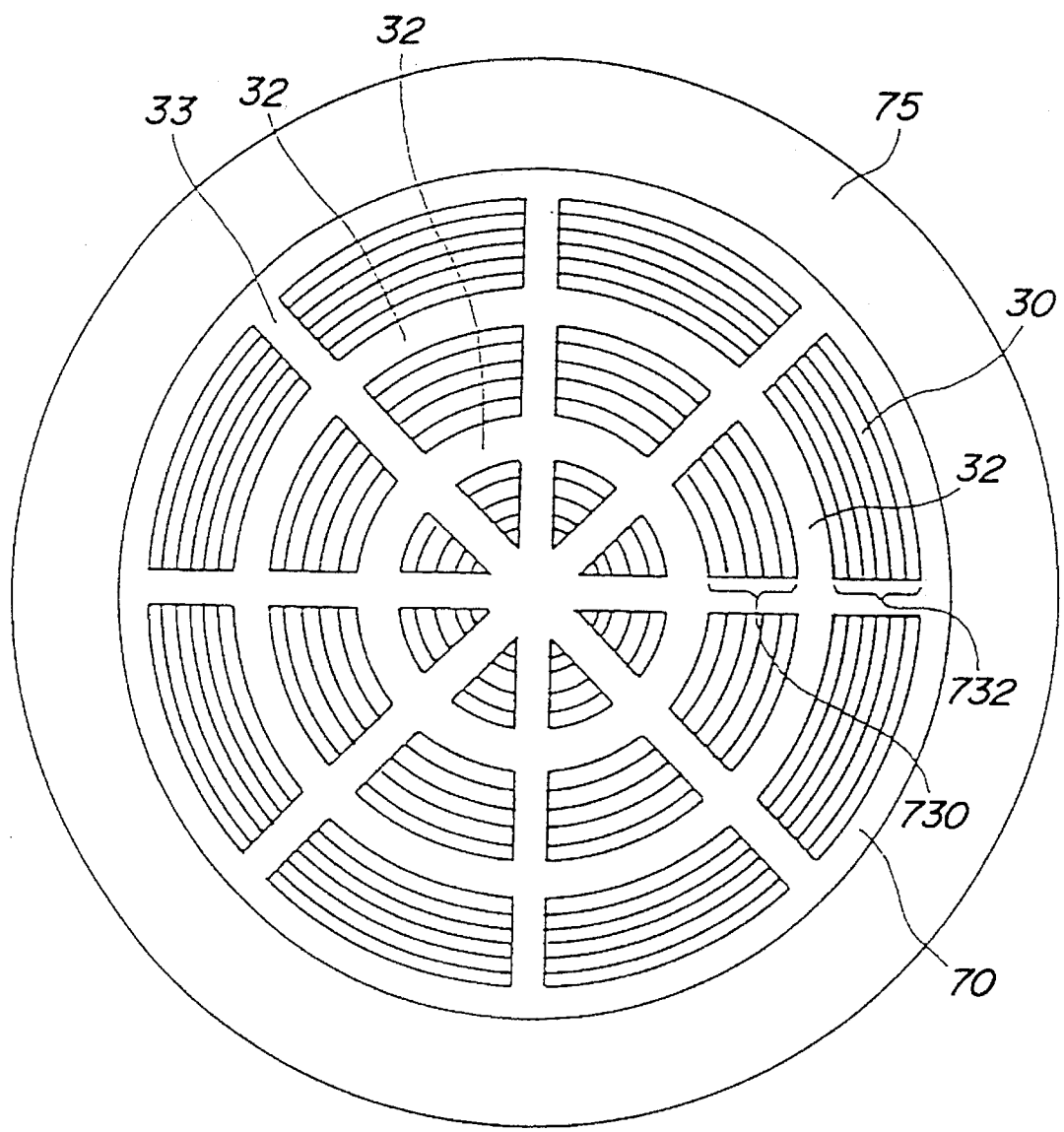
FIG. 16 is a plan view showing a structure and a manufacturing method of the static induction thyristor as the third embodiment of the present invention.

FIG. 15 is a plan view showing a static induction thyristor as the third embodiment of the present invention and a manufacturing method of the thyristor; FIG. 16 is a plan view illustrating the static induction thyristor of the third embodiment, which does not include a cathode electrode 50, N$^+$-type layer 22 and a N$^-$-type substrate 20; and FIG. 17 is a sectional view taken along the line X—X in FIG. 15.

Figure 17:
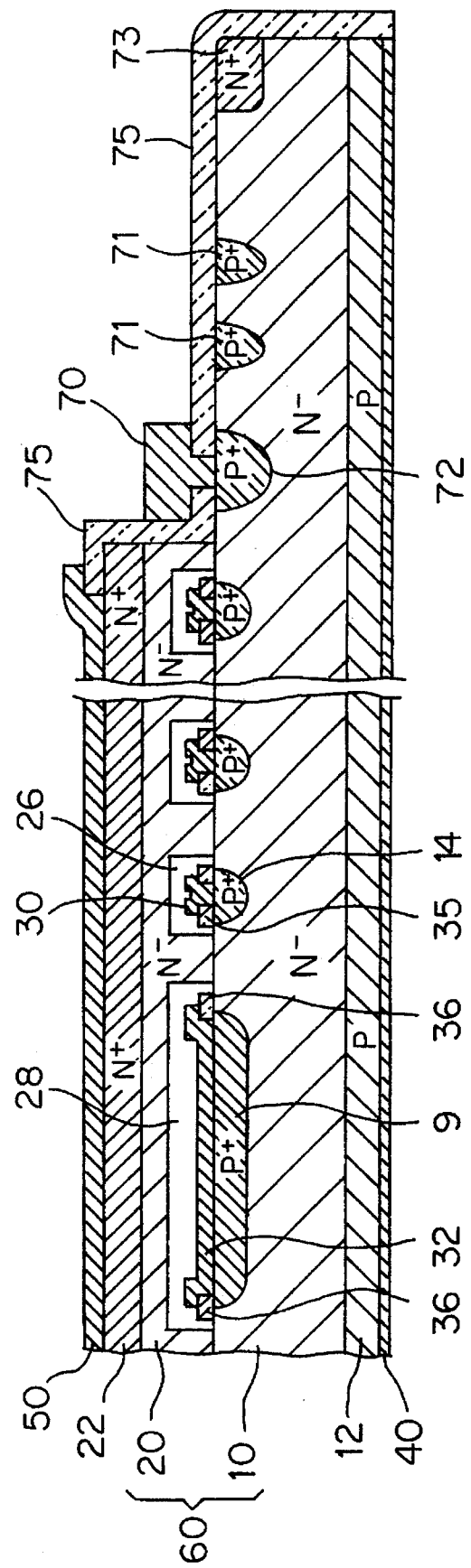
FIG. 17 is a sectional view taken along the line X—X in FIG. 15.

As shown in FIG. 17, double guard rings 71 are formed in the outer peripheral portion of the first N$^-$-type substrate 10 to mitigate a concentration of an electric field, and an N$^+$-type channel stopper 73 is formed in the most outer peripheral portion of the N$^-$-type substrate 10 to prevent a depletion layer from expanding to the outer end portion of the N$^-$-type substrate 10. A distance between the outermost guard ring 71 and the channel stopper 73 is set to a value not less than a thickness of the N$^-$-type substrate 10.

The outer peripheral portion of the N$^-$-type substrate 10 is covered with an insulating layer 75 of SiO$_2$. The insulating layer 75 is also provided on the lateral surfaces of the second N$^-$-type substrate 20 and the N$^+$-type layer 22, and it extends to the peripheral portion of the upper surface of the N$^+$-type layer 22. A cathode electrode 50 is formed on the N$^+$-type layer 22, and the peripheral portion of the electrode covers the insulating layer 75 provided on the peripheral portion of the N$^+$-type layer 22.

An annular gate electrode extension 70 is formed on the upper surface of the N$^-$-type substrate 10 within the inner guard ring 71. An annular P$^+$-type layer 72 is formed in the upper surface of the N$^-$-type substrate 10 lying under the gate electrode extension 70. A thickness of the P$^+$-type layer 72 is equal to that of the guard ring 71. The gate electrode extension 70 is connected to an external lead bonding portion (not shown). After joining the first N$^-$-type substrate 10 and the second N$^-$-type substrate 20 together, the peripheral portion of the second N$^-$-type substrate 20 is removed by etching to expose the peripheral surface of the N$^-$-type substrate 10, and the insulating layer 75 is formed thereon. The gate electrode extension 70 is formed on this insulating layer 75.

On the upper surface of the N$^-$-type substrate 10 within the inner side of the gate electrode extension 70, wide P$^+$-type gate regions 9 having a width of 100–400 μm, on each of which a wide gate electrode 32 of tungsten is formed, are provided in a concentrical manner. Although only two of them are shown in FIG. 16 for the purpose of making the figure simple, there are actually formed about 20–30 wide gate regions and wide gate electrodes.

In a region 730 lying between the two wide gate electrodes 32 as well as in a region 732 lying between the gate electrode 32 and the gate electrode extension 70 on the upper surface of the N⁻-type substrate 10, narrow P⁺-type gate regions 14 having a width of 10–20 μm are provided in a concentrical manner. Although only several of them are shown in FIG. 16 for the purpose of making the figure simple, about 50–100 of narrow gate regions 14 are actually formed in each of the regions 730 and 732. On each of the narrow P⁺-type gate region 14, a narrow gate electrode 30 of tungsten is formed in a concentrical manner.

The concentrically arranged gate electrodes 30, gate electrodes 32 and gate electrode extension 70 are connected by a wide gate electrode 33, which is extending in a radial direction. By arranging the concentrical wide gate electrodes 32 and the radially-extending wide gate electrode 33, the narrow gate electrodes 30 and the gate electrode extension 70 can be connected with a low resistance.

A PN junction between the narrow P⁺-type gate region 14 and the N⁻-type substrate 10 is covered with an insulating layer 35 of $SiO_2$, and a PN junction between the wide P⁺-type gate region 9 and the N⁻-type substrate 10 is covered with an insulating layer 36 of SiO2. By arranging the insulating layer 35 covering the PN junction between the narrow P⁺-type gate region 14 and the N⁻-type substrate 10 as well as the insulating layer 36 covering the PN junction between the wide P⁺-type gate region 9 and the N⁻-type substrate 10, passivation effects are attained in these PN junctions, thereby improving the breakdown voltage between the gate and the cathode.

In the lower surface of the second N⁻-type substrate 20, there are concentrically formed recessed portions 26 and recessed portions 28, respectively for housing the narrow gate electrode 30 and the insulating layer 35 and for housing the wide gate electrode 32 and the insulating layer 36.

Specific structures of the wide P⁺-type gate region 9, the wide gate electrode 32, the recessed portion 28 for housing the wide gate electrode 32, the wide gate electrode 33, the gate electrode extension 70, the P⁺-type layer 72 lying under the gate electrode extension 70, the guard ring 71, the channel stopper 73, the insulating layer 75, the cathode electrode 50 and the like described hereinbefore are not restricted to the present embodiment, and may be applied in the aforementioned first and second embodiments as well as in semiconductor layers of the following embodiments to be explained later.

Incidentally, the static induction thyristor of the present embodiment can be produced in substantially the same manner as in the first embodiment.

Figure 18:
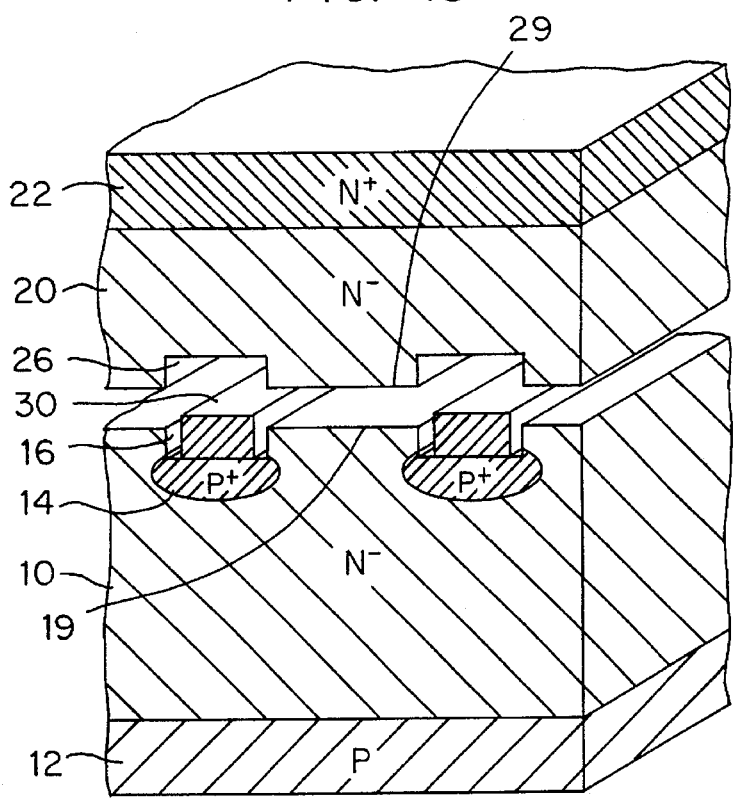
FIG. 18 is a sectionally perspective view illustrating a method of manufacturing a static induction thyristor as a fourth embodiment of the present invention.
Figure 19:
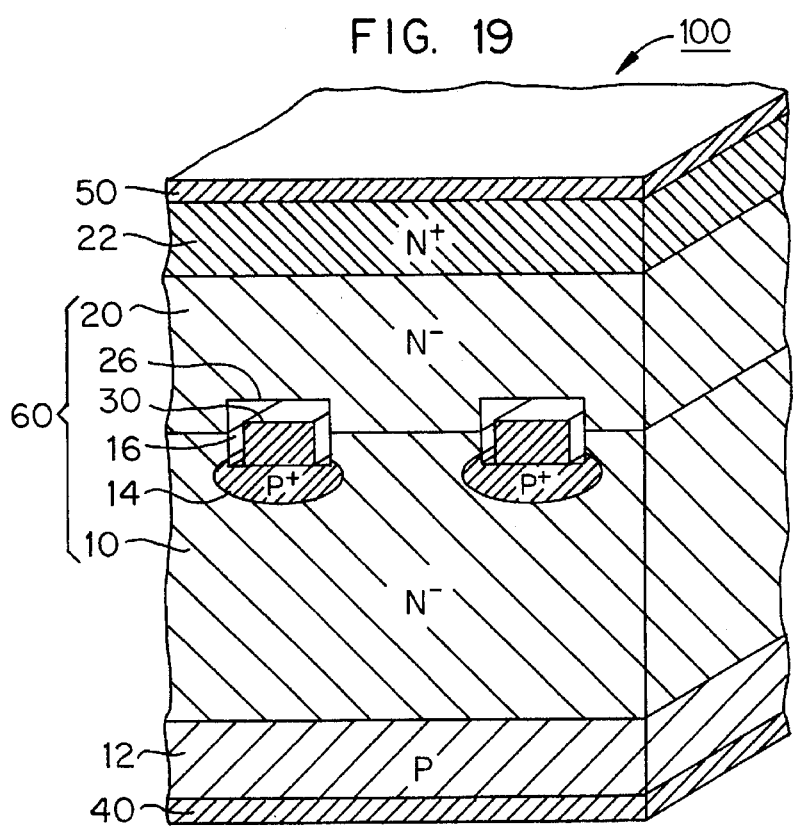
FIG. 19 is a sectionally perspective view representing a structure and a manufacturing method of the static induction thyristor as the fourth embodiment of the present invention.

FIGS. 18 and 19 are sectionally perspective views illustrating a static induction thyristor of a fourth embodiment of the present invention and a manufacturing method of the thyristor.

The structure and manufacturing method of this embodiment are same as those of the first embodiment except that recessed portions 16 are formed in the upper surface of the first N⁻-type substrate 10 in addition to recessed portions 26 formed in the lower surface of the second N⁻-type substrate 20 as shown in FIG. 18, the P⁺-type gate region 14 is selectively formed in the bottom surface of each of the recessed portions 16, and then the projected portions 29 in the lower surface of the N⁻-type substrate 20 and the upper surface 19 (the projected portions 19) of the N⁻-type substrate 10 exposed between the P⁺-type gate regions 14 are joined together as shown in FIG. 19.

In the present embodiment, there are formed not only the recessed portions 26 in the lower surface of the second N⁻-type substrate 20 but also the recessed portions 16 in the upper surface of the first N⁻-type substrate 10, and the gate electrodes 30 are housed by these recessed portions 16 and 26. Therefore, when compared with the first embodiment where the gate electrodes 30 are housed only by the recessed portions 26, the aspect ratio of the respective recessed portions 26 and 16 can be smaller. Accordingly, these recessed portions 16 and 26 can be formed more easily.

Figure 20:
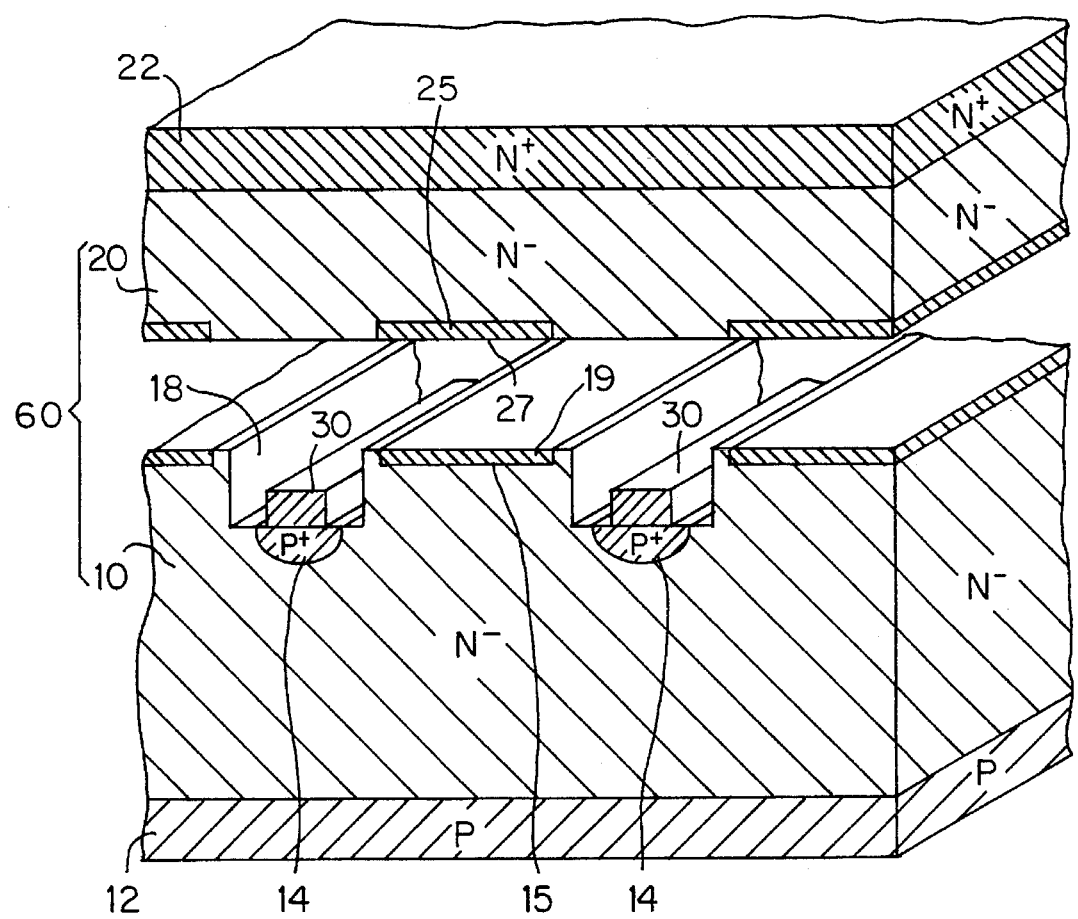
FIG. 20 is a sectionally perspective view showing a method of manufacturing a static induction thyristor as a fifth embodiment of the present invention.
Figure 21:
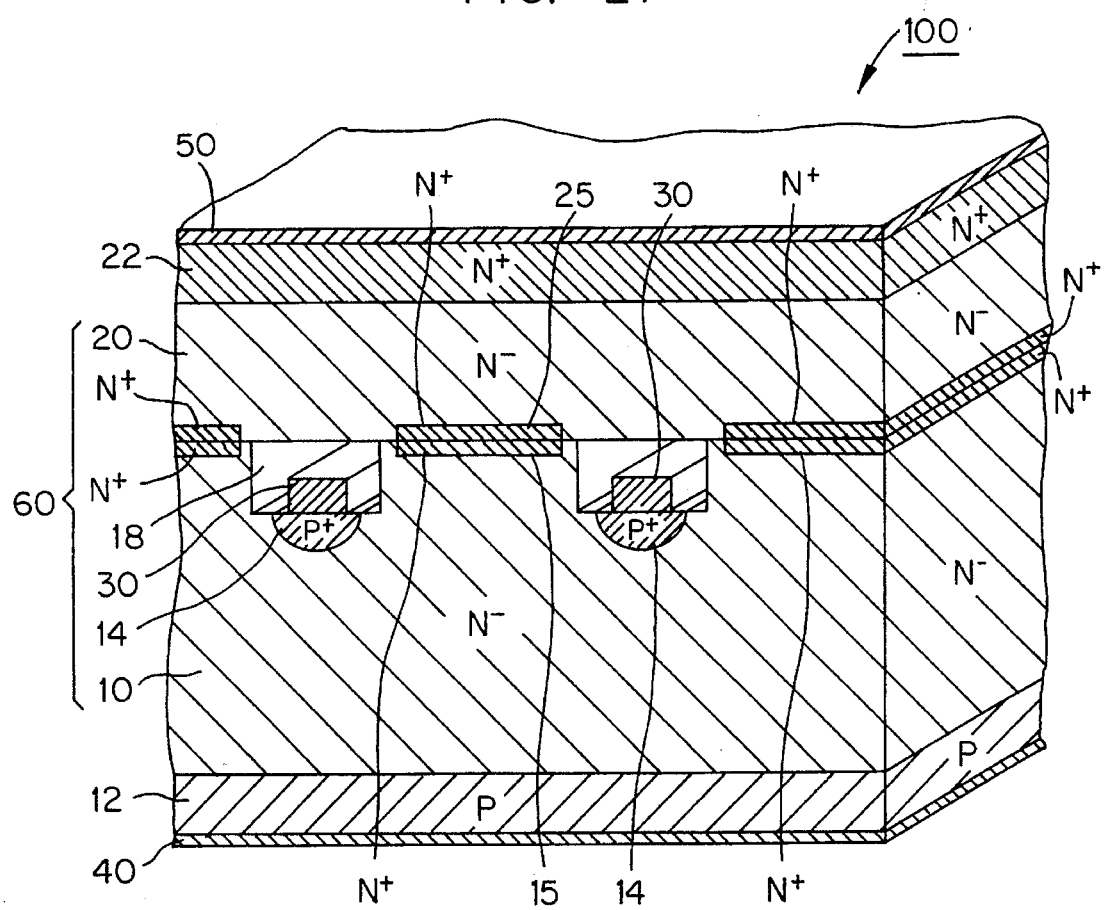
FIG. 21 is a sectionally perspective view illustrating a structure and a manufacturing method of the static induction thyristor as the fifth embodiment of the present invention.

FIGS. 20 and 21 are sectionally perspective views illustrating a static induction thyristor of a fifth embodiment of the present invention and a manufacturing method of the thyristor.

First of all, similar to the first embodiment, there are prepared a first N⁻-type substrate 10 and a second N⁻-type substrate 20, respectively having been subjected to a mirror-polishing at least in surfaces to be joined with each other.

Then, as shown in FIG. 20, recessed portions 18, each of which can house each of gate electrodes 30, are formed in the upper surface of the first N⁻-type substrate 10 by a photolithography technique. Next, by selectively diffusing P-type impurities into the bottom surfaces of the recessed portions, P⁺-type gate regions 14 are formed therein at intervals of 40 μm in such a manner that portions of the upper surface 19 of the first N⁻-type substrate 10 are exposed between the gate regions 14. Then, a gate electrode 30 made of a tungsten is selectively formed on each P⁺-type gate region 14 by a photolithography technique. Also, N⁺-type contact regions 15 having a thickness of 20 Å are formed in the portions of the upper surface 19 of the N⁻-type substrate 10 exposed between the gate regions 14.

Meanwhile, the lower surface 27 of the second N⁻-type substrate 20 is provided with N⁺-type contact regions 25 having a thickness of 50 Å in positions corresponding to the N⁺-type contact regions 15 formed in the portions of the upper surface 19 of the first N⁻-type substrate 10. An N⁺-type layer 22 is formed in advance in the upper surface of the N⁻-type substrate 20 by an impurity diffusion.

After removing organic and metallic substances from the N⁻-type substrates 10 and 20 by ultrasonic cleaning with use of sulfuric acid and aqueous solution of hydrogen peroxide, these N⁻-type substrate 10 and 20 are cleaned with a pure water and are dried by a spinner at a room temperature.

Then, as shown in FIG. 21, while keeping the upper surface 19 of the first N⁻-type substrate 10 exposed between the P⁺-type gate regions 14 and the lower surface 27 of the second N⁻-type substrate 20 to be brought into contact with each other, the N⁻-type substrate 10 and the N⁻-type substrate 20 are heated at 800° C. in a hydrogen atmosphere to be joined together. Next, an anode electrode 40 and a cathode electrode 50 are respectively formed on the lower surface of the P-type layer 12 formed in the lower surface of the first N⁻-type substrate 10 and on the upper surface of the N⁺-type layer 22 formed on the upper surface of the second N⁻-type substrate 20.

In the thus-produced static induction thyristor 100, the P-type layer 12 functions as an anode region, the N⁺-type layer 22 as a cathode region, the N⁻-type substrate 10 and the N⁻-type substrate 20 as an N-type base 60, and the P⁺-type gate region 14 and the gate electrode 30 functions as a gate, which controls an anode current flowing between the anode electrode 40 and the cathode electrode 50.

Since the N-type base 60, in which the P⁺-type gate region 14 is embedded, is formed by joining the first and second N⁻-type substrates 10 and 20 together also in this embodiment, the obtained N-type base 60 has a uniform crystal structure of good quality. In addition, it does not involve such a problem that the conductivity type of the N-type base 60 is changed to P-type in the portions lying between the P⁺-type gate regions 14. Accordingly, the control of the anode current can be performed.

In addition, since the gate electrode 30 of tungsten is formed on the P⁺-type gate region 14, the gate lateral resistance is reduced, thereby increasing the maximum cut-off current. Also, since the gate electrode 30 is housed in the recessed portion 18 of the first N⁻-type substrate 10, it is not necessary to divide the N⁺-type layer 22 and the N⁻-type substrate 20 into small pieces for the purpose of forming the gate electrode 30, which leads to a high resistance. Moreover, it is not necessary to form the gate electrode 30 within a groove having a large aspect ratio.

Since the recessed portion 18 formed in the upper surface of the first N⁻-type substrate 10 is only required to have a space enough to house the gate electrode 30, the formation thereof does not require a long time.

Furthermore, the gate electrodes 30 are housed in the recessed portions 18 formed in the upper surface of the N⁻-type substrate 10, it is no longer necessary to form recessed portions in the lower surface 27 of the N⁻-type substrate 20, which surface is to be joined with the portions of the upper surface 19 of the first N⁻-type substrate 10 exposed between the gate electrodes 30. Namely, the lower surface 27 of the N⁻-type substrate 20 may be formed as a flat surface. Accordingly, any special positioning is not required at a time when the upper surface 19 of the N⁻-type substrate 10 is joined with the lower surface 27 of the N⁻-type substrate 20, resulting in an easier manufacturing.

By providing N⁺-type contact regions 15 and 25, a contact resistance between the upper surface 19 of the N⁻-type substrate 10 exposed between the P⁺-type gate regions 14 and the lower surface 27 of the N⁻-type substrate 20 is decreased, thereby realizing an electrically good connection.

Figure 22:
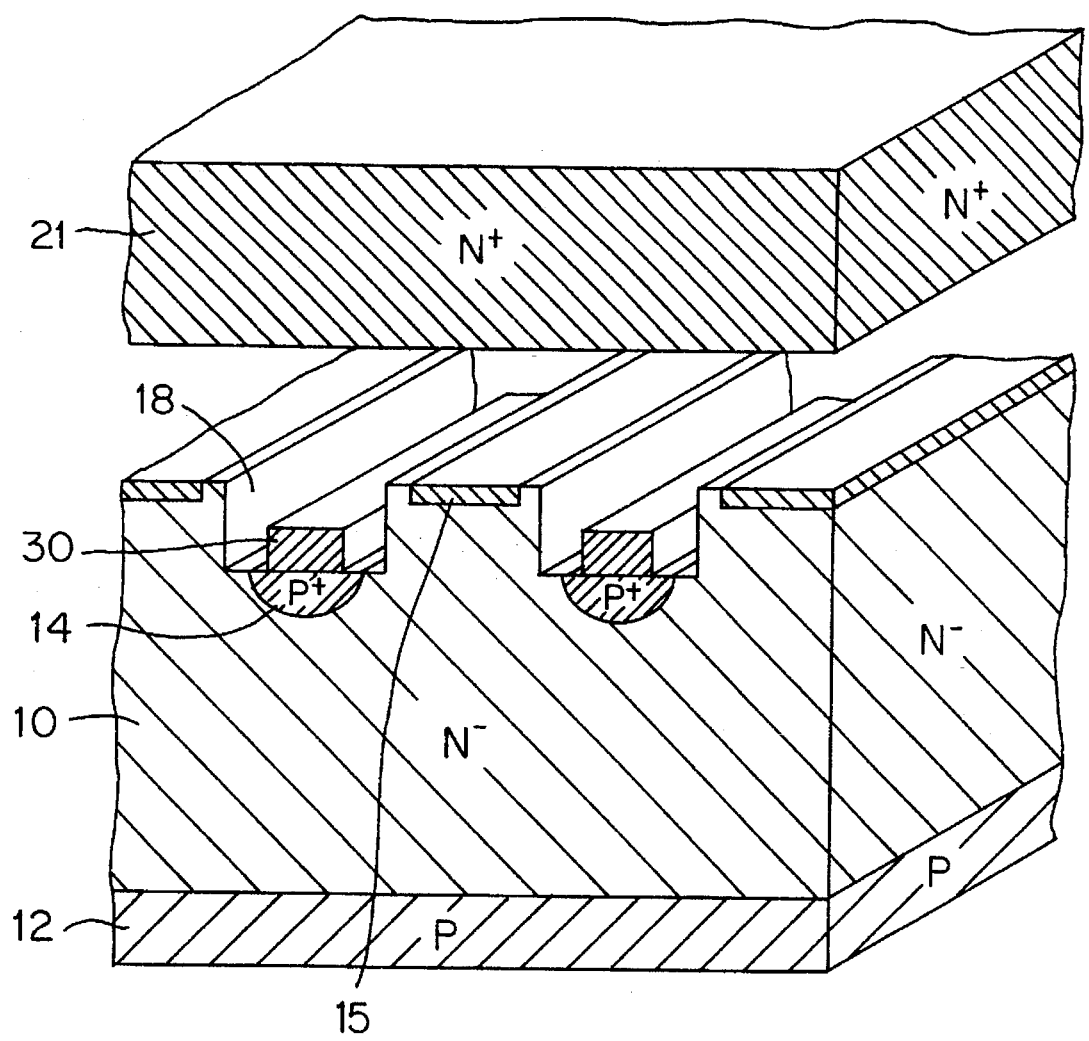
FIG. 22 is a sectionally perspective view depicting a method of manufacturing a static induction thyristor as a sixth embodiment of the present invention.
Figure 23:
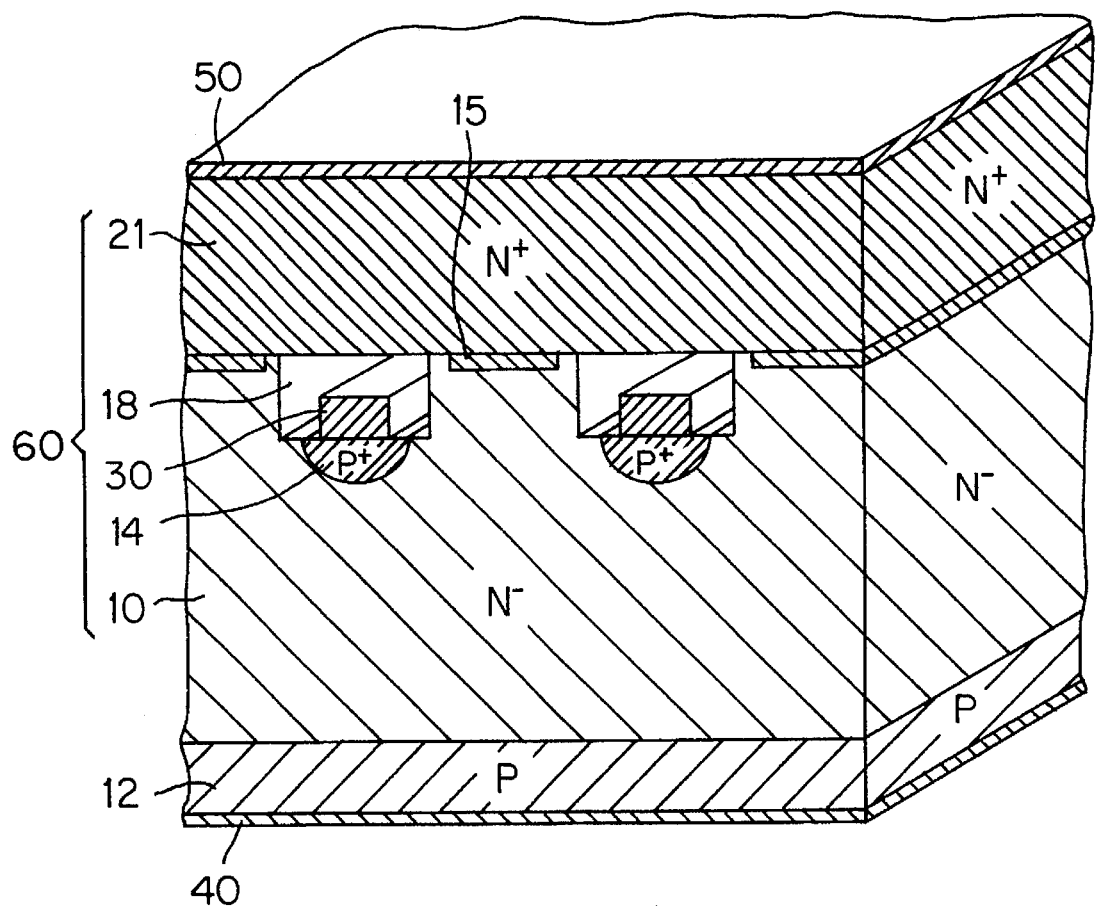
FIG. 23 is a sectionally perspective view illustrating a structure and a manufacturing method of the static induction thyristor as the sixth embodiment of the present invention.

FIGS. 22 and 23 are sectionally perspective views illustrating a static induction thyristor of a sixth embodiment of the present invention and a manufacturing method of the thyristor.

In the above-described fifth embodiment, the N⁺-type contact regions 25 are formed in the lower surface 27 of the second N⁻-type substrate 20, and the N⁺-type cathode layer 22 is formed in the upper surface thereof. The structure and manufacturing method of this embodiment is the same as those of the fifth embodiment except that an N⁺-type substrate 21 is used in place of the N⁻-type substrate 20 as the second semiconductor substrate.

By using the N⁺-type substrate 21 instead of the N⁻-type substrate 20, an excellent electrical connection with the upper surface 19 of the first N⁻-type substrate 10 can be obtained without providing the lower surface 27 of the N⁻-type substrate 20 with the N⁺-type contact regions 25, and an excellent ohmic contact with the cathode electrode 50 can be obtained without providing the upper surface of the N⁻-type substrate 20 with the N⁺-type layer 22. Accordingly, the manufacturing process can be simplified.

Figure 24:
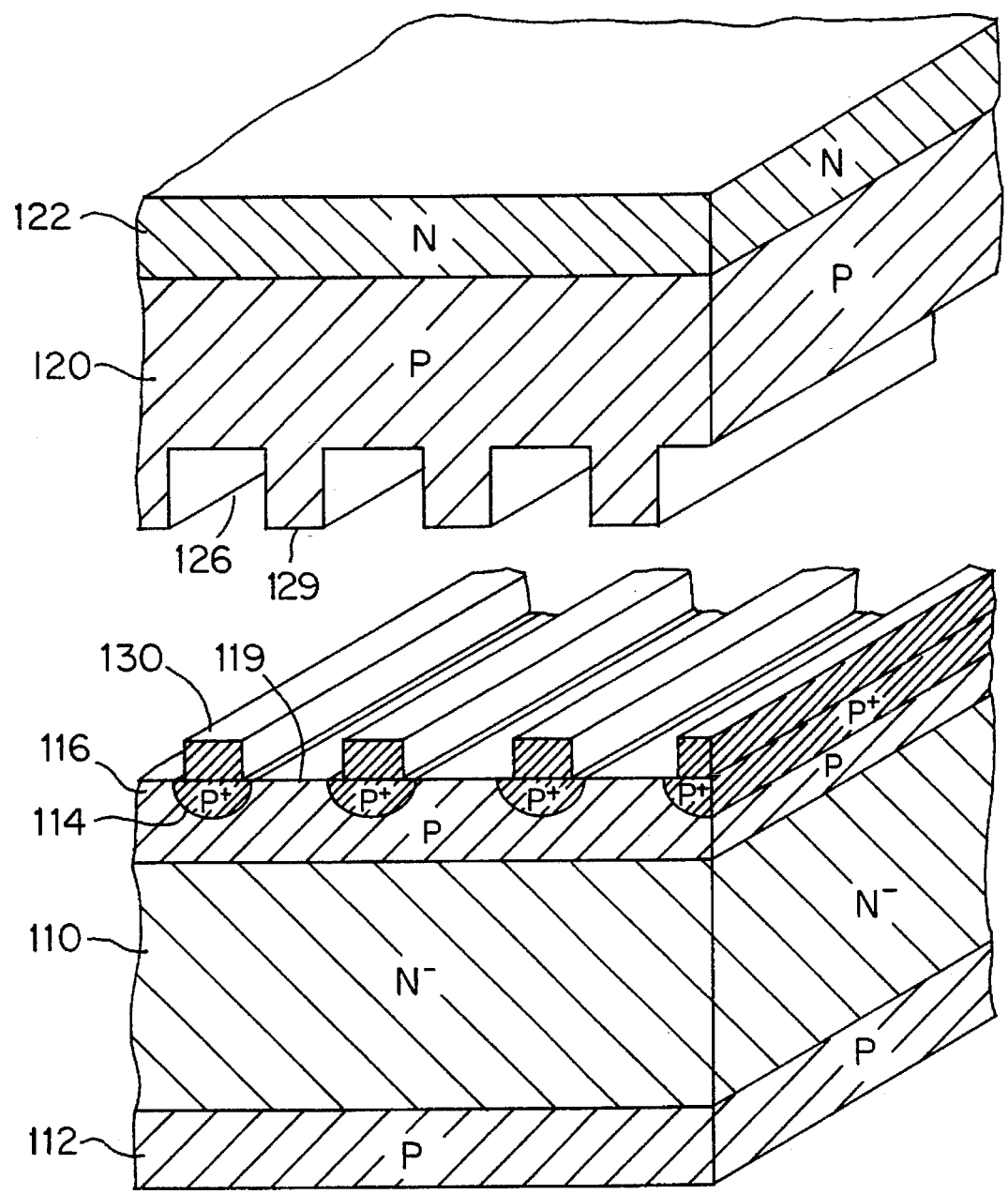
FIG. 24 is a sectionally perspective view showing a method of manufacturing a GTO thyristor as a seventh embodiment of the present invention.
Figure 25:
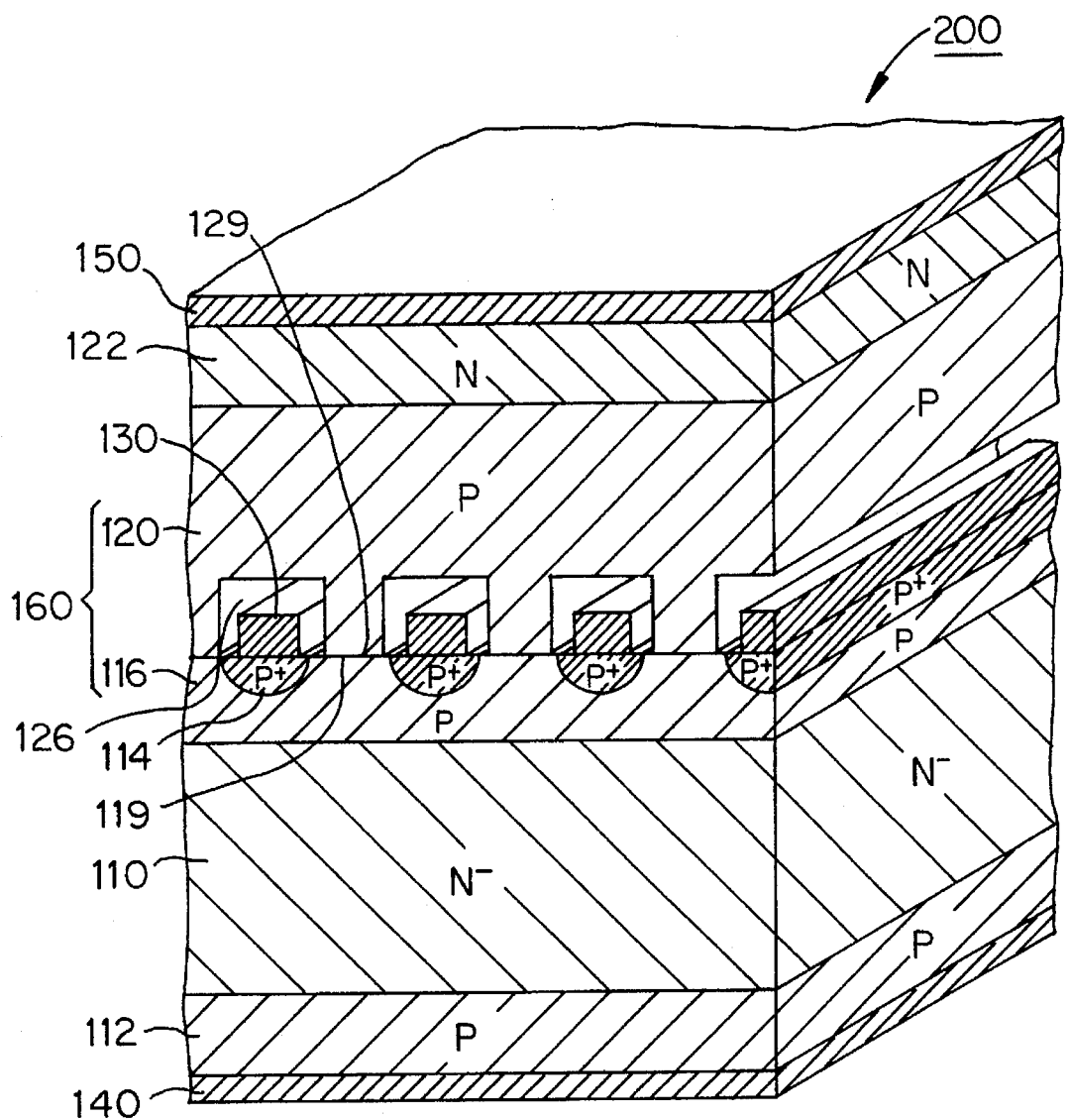
FIG. 25 is a sectionally perspective view illustrating a structure and a manufacturing method of the GTO thyristor as the seventh embodiment of the present invention.

FIGS. 24 and 25 are sectionally perspective views illustrating a GTO thyristor of a seventh embodiment of the present invention and a manufacturing method of the thyristor.

First of all, there are prepared a first and a second semiconductor substrates 110 and 120, respectively having been subjected to a mirror-polishing at least in surfaces to be joined with each other. In this embodiment, the first semiconductor substrate is constituted by an N⁻-type substrate 110 and the second semiconductor substrate is constituted by a P-type substrate 120.

Next, as shown in FIG. 24, a P-type layer 116 is formed in the upper surface of the N⁻-type substrate 110 by an impurity diffusion, and by selectively diffusing P-type impurities into an upper surface 119 of the P-type layer 116, P⁺-type gate regions 114 are formed therein at an interval of 30 μm in such a manner that portions of the upper surface 119 of the P-type layer 116 are exposed between the gate regions 114. Then, a gate electrode 130 made of a tungsten is selectively formed on each of the P⁺-type gate regions 114 by the photolithography technique. Also, a P-type layer 112 is formed in the lower surface of the N⁻-type substrate 110 by the impurity diffusion.

Meanwhile, recessed portions 126, each of which can house each of gate electrodes 130, are formed in the lower surface of the P-type substrate 120 by the photolithography technique. Portions other than the recessed portions 126 in the lower surface of the P-type substrate 120 constitute projected portions 129 which are to be joined with the upper surface 119 of the P-type layer 116 exposed between the P⁺-type gate regions 114. An N-type layer 122 is formed in the upper surface of the P-type substrate 120 by the impurity diffusion.

After removing organic and metallic substances from the N⁻-type substrates 110 and the P-type substrate 120 by ultrasonic cleaning with use of sulfuric acid and aqueous solution of hydrogen peroxide, the N⁻-type substrates 110 and the P-type substrate 120 are cleaned with a pure water and are dried by a spinner at a room temperature.

Then, as depicted in FIG. 25, while keeping the upper surface 119 of the P-type layer 116 exposed between the P⁺-type gate regions 114 and projected portions 129 of the P-type substrate 120 to be brought into contact with each other, the N⁻-type substrate 110 and the P-type substrate 120 are heated at 800° C. in an H₂ atmosphere and the substrates are joined together. Next, an anode electrode 140 and a cathode electrode 150 are respectively formed on the lower surface of the P-type layer 112 and the upper surface of the N-type layer 122.

In the thus-obtained GTO thyristor 200, the P-type layer 112 functions as a P-type emitter, N-type layer 122 as an N-type emitter, the N⁻-type substrate 110 as an N-type base, both P-type layer 116 and P-type substrate 120 as P-type base 160, and the P⁺-type gate region 114 and the gate electrode 130 function as a gate which controls an anode current flowing between the anode electrode 140 and the cathode electrode 150.

Since the P-type base 160, in which the P⁺-type gate region 114 is embedded, is formed by joining the P-type layer 116 and the P-type substrate 120 together, the obtained P-type base 160 has a uniform crystal structure of good quality. In addition, it does not involve such a problem that an impurity concentration of the P-type base 160 becomes too high in portions between the P⁺-type gate regions 114 to pass the anode current.

In addition, since the gate electrode 130 made of a tungsten is formed on the P⁺-type gate region 114, the gate lateral resistance is decreased, thereby increasing the maximum cutoff current. Also, since the gate electrode 130 is housed in the recessed portion 126 of the P-type substrate 120, it is not necessary to divide the N-type layer 122 and the P-type substrate 120 into small pieces for the purpose of forming the gate electrode 130, which leads to a high resistance. Moreover, it is no more necessary to form the gate electrode 130 within a groove having a large aspect ratio.

Since the recessed portion 126 formed on the lower surface of the P-type substrate 120 is only required to have a space enough to house the gate electrode 130, the formation thereof does not take a long time.

In this embodiment, a joining process can be conducted at a high temperature because the gate electrode 130 is made of a tungsten, and thus there are obtained joined surfaces having a good quality.

While the joining process is conducted at 800° C. in this embodiment, it can be conducted at any temperature not lower than 400° C. However, it is not preferable to conduct the joining process at 1100° C. or higher, because impurities in the $P^+$-type gate regions 114 diffuse into the P-type layer 116 and the P-type substrates 120, exerting a bad influence on the properties of the thyristor. The joining process is more preferably conducted at a temperature within a range of 700°–1100° C. under an atmospheric pressure. The reason is that there happen less thermal diffusions of impurities and a deformation of the crystal lattice can be suppressed to a small amount at such a temperature.

Although the $N^-$-type substrate 110 and the P-type substrates 120 are joined together without being applied with a pressure in this embodiment, it is preferable to conduct the joining process while applying a pressure from the outer sides of the $N^-$-type substrate 110 and the P-type substrates 120. By applying a pressure thereto, the joining temperature can be set at a lower one, the thermal diffusion can be suppressed, and there can be decreased such portions that are not in a contacted state. It is preferable to apply a pressure within a range of 0.1 kg/cm$^2$–100 kg/cm$^2$. When it is not more than 0.1 kg/cm$^2$, the contact is not sufficient. On the other hand, when the applied pressure is not less than 100 kg/cm$^2$, a displacement might be caused by a deformation. When a pressure is applied to the substrates, the joining is conducted preferably at a temperature of 400°–1100° C., more preferably at a temperature of 500–1000° C. The reason why the joining temperature can be lowered to such a range is that material transfers in the contacted portion are accelerated by the applied pressure.

Figure 26:
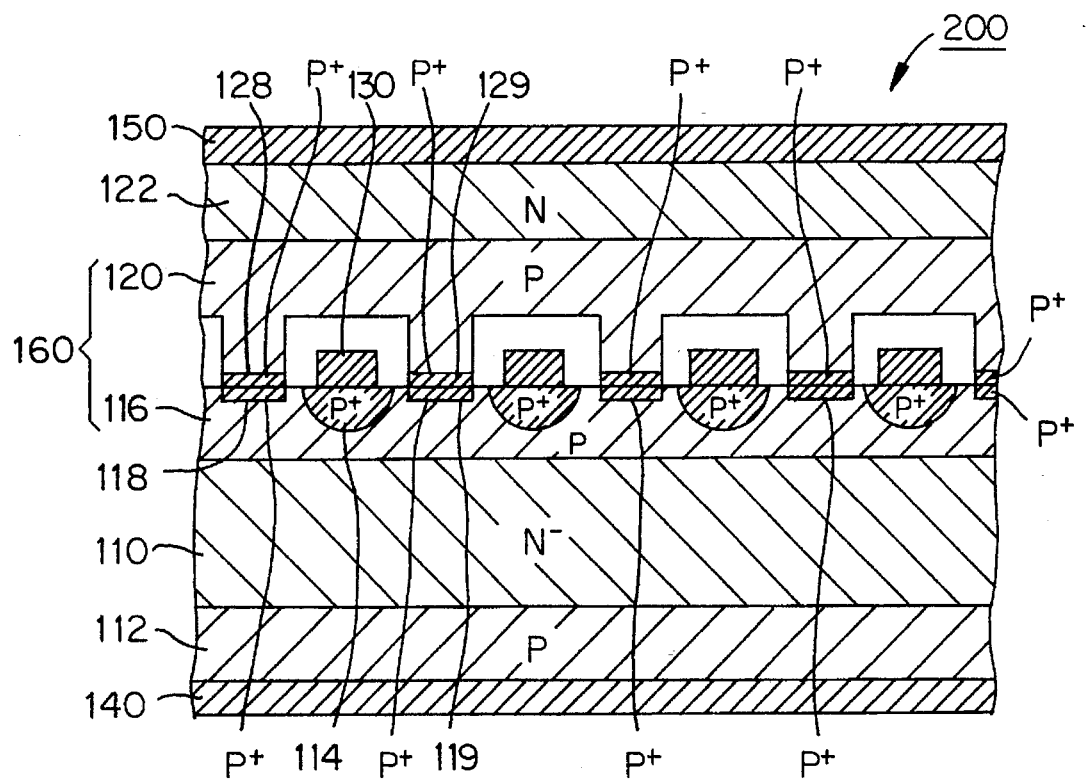
FIG. 26 is a sectional view depicting a method of manufacturing a GTO thyristor as an eighth embodiment of the present invention.

FIG. 26 is a sectionally perspective view illustrating a GTO thyristor of an eighth embodiment of the present invention and a manufacturing method of the thyristor.

The structure and manufacturing method of this embodiment is the same as those of the sixth embodiment except that a $P^+$-type contact region 118 and $P^+$-type contact region 128 are respectively formed in the upper surface 119 of the P-type layer 116 at portions exposed between the $P^+$-type gate regions 114 and in the lower surface of the projected portions 129 formed in the lower surface of the P-type substrate 120.

These $P^+$-type contact regions 118 and 128 are formed before joining the $N^-$-type substrate 110 and the P-type substrate 120. By forming these $P^+$-type contact regions 118 and 128, an electrical connection can be improved between the upper surface 119 of the P-type layer 116 exposed between the $P^+$-type gate regions 114 and the lower surface of the projected portions 129 formed in the lower surface of the P-type substrate 120. A thickness of the $P^+$-type contact regions 118 and 128 is set to 100 Å. Although two kinds of contact regions, namely the $P^+$-type contact regions 118 and 128, are formed in the present embodiment, it is sufficient to form either one of them.

Figure 27:
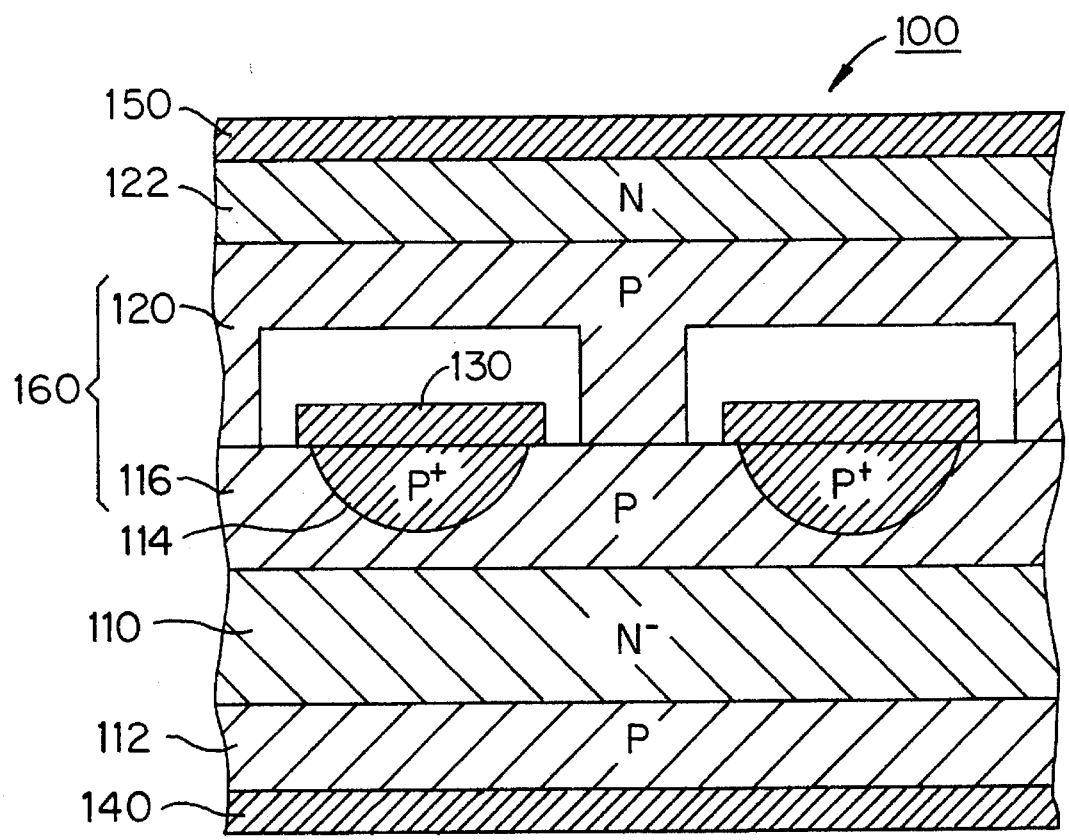
FIG. 27 is a sectional view showing a structure and a manufacturing method of the GTO thyristor as a ninth embodiment of the present invention.

FIG. 27 is a sectional view illustrating a GTO thyristor of an ninth embodiment of the present invention and a manufacturing method of the thyristor.

The structure and manufacturing method of this embodiment are same as those of the fifth embodiment except that the gate electrode 130 is arranged to cover the interface between the $P^+$-type gate region 114 and the P-type layer 116.

By forming the gate electrode 130 to cover the interface between the $P^+$-type gate region 114 and the P-type layer 116, the gate resistance can be more effectively reduced, thereby increasing the operating frequency.

Although the present invention has been explained, in the above embodiments, in the form of thyristors, the present invention can be also applied to static induction transistors by replacing the $P^+$-type layer 12 formed in the lower surface of the first semiconductor substrate 10 with an $N^+$-type drain, in the static induction thyristors of the first to fourth embodiments described with reference to FIGS. 11–16.

Also, the present invention is not restricted to the embodiments described above, and is of course applicable to static induction thyristors having a pin structure or a anode-short structure as well as to anode-short type GTO thyristors.

POSSIBILITY OF INDUSTRIAL UTILIZATION

As described above, in the manufacturing method according to the present invention, there are prepared a first and a second semiconductor substrates of one conductivity type respectively having a first and a second main surfaces, a plurality of gate regions consisting of semiconductor material are selectively formed in the first main surface of the first semiconductor substrate by partially doping impurities into the first main surface of the first semiconductor substrate in such a manner that portions of the first main surface of the first semiconductor substrate are exposed between the gate regions, a gate electrode made of an electrically good-conductive body is provided on each one of the gate regions, and the first and second semiconductor substrates are brought into contact with each other. Accordingly, the base region, in which the gate region is embedded, is formed by joining the first and second semiconductor substrates together without conducting an epitaxial growth. As a result, the thus-obtained base region has a uniform crystal structure of good quality, and there does not occur a change in the conductivity type of the base region in portions between the gate regions, which makes it impossible to control the anode current. It is also possible to dope impurities into the gate region at a higher concentration.

Since the recessed portions are formed in both of the first and second semiconductor substrates or either one of them as to house the gate electrodes, it is no longer necessary to form deep grooves extending from the second main surface of the second semiconductor substrate. Accordingly, it can be avoided to divide the cathode region into small pieces, which leads to an increase in the resistance. Also, since it is only necessary for the first recessed portion in a main surface of the second semiconductor substrate to have a space enough to house the gate electrode, the recessed portion does not need to be made as a deep recess. Accordingly, it does not take a long time to form the first recessed portion even by dry etching having a low etching rate. Moreover, since the gate electrodes are housed in the first recessed portions formed in the main surface of the second semiconductor substrate, it is not necessary to form gate electrodes within grooves having a large aspect ratio.

Especially in such a case where recessed portions are formed in both of the first main surfaces of the first and second semiconductor substrates, the aspect ratio of the respective recessed portions can be smaller as compared with the case where the gate electrodes are housed by only using the first recessed portions, and thus it becomes easier to form the recessed portions.

Furthermore, by providing portions of the first and second semiconductor substrates to be contacted with each other with contact regions having an impurity concentration higher than that of these semiconductor substrates, contact resistances of these semiconductor substrates can be decreased, thereby realizing an electrically good connection.

I claim:

1. A semiconductor device comprising:
   a semiconductor substrate;
   an anode electrode provided on a surface of said semiconductor substrate;
   a cathode electrode provided on the opposite surface of said semiconductor substrate; and
   a gate formed within said semiconductor substrate for controlling a current flowing between said anode electrode and said cathode electrode;
   wherein said gate comprises (i) at least two gate regions of semiconductor material doped with at least one impurity and (ii) a portion of an electrically conductive gate electrode formed on each said gate region.

2. The semiconductor device according to claim 1, wherein said semiconductor substrate comprises a first semiconductor substrate having a surface and a second semiconductor substrate having a surface fixed to said surface of said first semiconductor substrate, wherein at least one of said surfaces of said first and second semiconductor substrates has a recessed portion for housing said gate electrode.

3. The semiconductor device according to claim 2, wherein a contact region of at least one of said surfaces of said first and second semiconductor substrates has an impurity concentration higher than that of the respective semiconductor substrate.

4. The semiconductor device according to claim 3, wherein said gate electrode comprises a high melting point metal.

5. The semiconductor device according to claim 2, wherein said gate electrode comprises a high melting point metal.

6. The semiconductor device according to claim 2, wherein said first and second semiconductor substrates have the same type of conductivity.

7. The semiconductor device according to claim 1, wherein said semiconductor substrate includes a first semiconductor layer of one conductivity type, a second semiconductor layer of the opposite conductivity type formed on said first semiconductor layer, and a third semiconductor layer of said opposite conductivity type formed on said second semiconductor layer and having an impurity concentration higher than that of said second semiconductor layer; one of said anode electrode and cathode electrode is electrically connected to said first semiconductor layer; the other one of said anode electrode and cathode electrode is electrically connected to said third semiconductor layer; and at least said gate regions are formed within said second semiconductor layer.

8. The semiconductor device according to claim 7, wherein said gate electrode comprises a high melting point metal.

9. The semiconductor device according to claim 1, wherein said semiconductor substrate includes a first semiconductor layer of one conductivity type, a second semiconductor layer of the opposite conductivity type formed on said first semiconductor layer, a third semiconductor layer of said one conductivity type formed on said second semiconductor layer, and a fourth semiconductor layer of said opposite conductivity type formed on said third semiconductor layer; one of said anode electrode and cathode electrode is electrically connected to said first semiconductor layer; the other one of said anode electrode and cathode electrode is electrically connected to said fourth semiconductor layer; and at least said gate regions are formed within said third semiconductor layer of said one conductivity type so that said gate regions have an impurity concentration higher than that of said third semiconductor layer.

10. The semiconductor device according to claim 9, wherein said gate electrode comprises a high melting point metal.

11. The semiconductor device according to claim 9, wherein said gate regions are formed to be exposed in the surface of said third semiconductor layer; and said gate electrode is formed to cover a junction between said gate regions and said third semiconductor layer.

12. The semiconductor device according to claim 11, wherein said gate electrode comprises a high melting point metal.

13. The semiconductor device according to claim 1, wherein said gate electrode comprises a high melting point metal.

* * * * *